United States Patent
Seike et al.

(10) Patent No.: US 12,336,363 B2
(45) Date of Patent: Jun. 17, 2025

(54) PHOTOELECTRIC CONVERSION ELEMENT

(71) Applicant: SUMITOMO CHEMICAL COMPANY, LIMITED, Tokyo (JP)

(72) Inventors: Takahiro Seike, Tsukuba (JP); Giovanni Ferrara, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 208 days.

(21) Appl. No.: 16/969,831

(22) PCT Filed: Mar. 22, 2019

(86) PCT No.: PCT/JP2019/012215
§ 371 (c)(1),
(2) Date: Aug. 13, 2020

(87) PCT Pub. No.: WO2019/182142
PCT Pub. Date: Sep. 26, 2019

(65) Prior Publication Data
US 2020/0381643 A1    Dec. 3, 2020

(30) Foreign Application Priority Data
Mar. 23, 2018   (JP) .................. 2018-056656

(51) Int. Cl.
*H01L 51/42*  (2006.01)
*H10K 30/15*  (2023.01)
(Continued)

(52) U.S. Cl.
CPC ........... *H10K 30/152* (2023.02); *H10K 30/20* (2023.02); *H10K 85/141* (2023.02);
(Continued)

(58) Field of Classification Search
CPC ............... H01L 51/4233; H01L 51/004; H01L 51/0046; H01L 51/424; H01L 27/288;
(Continued)

(56) References Cited

U.S. PATENT DOCUMENTS

| | | | |
|---|---|---|---|
| 7,999,339 B2* | 8/2011 | Yokoyama | H01L 27/14601 257/431 |
| 8,809,847 B2* | 8/2014 | Sawaki | B82Y 10/00 257/292 |

(Continued)

FOREIGN PATENT DOCUMENTS

| | | |
|---|---|---|
| CN | 106867305 B | 11/2017 |
| JP | 2009272528 A * | 11/2009 |

(Continued)

OTHER PUBLICATIONS

International Searching Authority, "International Search Report," issued in connection with International Patent Application No. PCT/JP2019/012215, dated Jun. 25, 2019.

(Continued)

*Primary Examiner* — Ermias T Woldegeorgis
(74) *Attorney, Agent, or Firm* — Foley & Lardner LLP

(57) ABSTRACT

To improve detectivity of a photoelectric conversion element (10). A photoelectric conversion element including a pair of electrodes (12, 16), an active layer (14) provided between the pair of electrodes, and an intermediate layer (13. 15) provided between the active layer and at least one of the pair of electrodes, in which the intermediate layer has a surface that is in contact with the active layer, the surface having a surface roughness having an absolute value greater than 0.22 nm but smaller than 1.90 nm, and in which the active layer is not less than 350 nm but not more than 800 nm in thickness.

14 Claims, 3 Drawing Sheets

(51) Int. Cl.
  H10K 30/20 (2023.01)
  H10K 85/10 (2023.01)
  H10K 85/20 (2023.01)
  *H10K 39/32* (2023.01)
  *H10K 65/00* (2023.01)
  *H10K 102/00* (2023.01)

(52) U.S. Cl.
  CPC ........... H10K 85/211 (2023.02); *H10K 39/32* (2023.02); *H10K 65/00* (2023.02); *H10K 2102/00* (2023.02)

(58) Field of Classification Search
  CPC . H01L 27/307; H01L 2251/303; H01L 51/44; H01L 51/4253; H01L 2251/558; H01L 31/10; Y02E 10/549; H10K 30/152; H10K 30/20; H10K 85/141; H10K 85/211; H10K 39/32; H10K 65/00; H10K 2102/00; H10K 30/30; H10K 2102/351; H10K 30/80; H10F 30/20
  See application file for complete search history.

(56) References Cited

U.S. PATENT DOCUMENTS

| | | | |
|---|---|---|---|
| 2010/0089452 A1* | 4/2010 | Hamano | H01L 27/307 136/263 |
| 2013/0015435 A1* | 1/2013 | Sawaki | H01L 27/307 257/E51.026 |
| 2017/0373250 A1 | 12/2017 | Eita et al. | |

FOREIGN PATENT DOCUMENTS

| | | | |
|---|---|---|---|
| JP | 2012023126 A | * | 2/2012 |
| JP | 5100909 B1 | * | 12/2012 |
| JP | 2013-055125 A | | 3/2013 |
| JP | 2014-026975 A | | 2/2014 |
| JP | 2014027177 A | * | 2/2014 |
| JP | 2017-168806 A | | 9/2017 |
| KR | 2015-0030287 A | | 3/2015 |
| KR | 20150133899 A | * | 12/2015 |
| WO | WO-2013/063562 A1 | | 5/2013 |
| WO | WO-2015/045730 A1 | | 4/2015 |
| WO | WO-2017/174491 A1 | | 10/2017 |

OTHER PUBLICATIONS

International Searching Authority, "Written Opinion," issued in connection with International Patent Application No. PCT/JP2019/012215, dated Jun. 25, 2019.
Arredondo et al., "Visible Light Communication System Using an Organic Bulk Heterojunction Photodetector," Sensors, vol. 13, 2013, pp. 12266-12276.
Extended European Search Report issued in corresponding European Patent Application No. 19771293.8 dated Nov. 19, 2021.
Kohnehpoushi, S., et al., "MoS2: a two-dimensional hole-transporting material for high-efficiency, low-cost perovskite solar cells," Nanotechnology, 29:205201 (2018) (8 pages).
Lampande, R., et al., "Solution processed n-type mixed metal oxide layer for electron extraction in inverted polymer solar cells," Solar Energy Materials & Solar Cells, 125:276-282 (2014) (7 pages).
Office Action issued in corresponding Japanese Patent Application No. 2020-507952, dated Apr. 4, 2023.
Office Action issued in corresponding European Patent Application No. 19771293.8 dated Oct. 30, 2023 (6 pages).

* cited by examiner thickness of the active layer(nm)

PHOTOELECTRIC CONVERSION ELEMENT

RELATED APPLICATIONS

The present application claims priority under 37 U.S.C. § 371 to International Patent Application No. PCT/JP2019/012215, filed Mar. 22, 2019, which claims priority to and the benefit of Japanese Patent Application No. 2018-056656, filed on Mar. 23, 2018. The contents of these applications are hereby incorporated by reference in their entireties.

TECHNICAL FIELD

The present invention relates to a photoelectric conversion element such as a light detecting element, and a manufacturing method thereof.

BACKGROUND ART

Photoelectric conversion elements, which are very useful devices for energy consumption reduction and carbon dioxide emission amount reduction, for example, have been drawing a lot of attention.

A photoelectric conversion element is an element at least including a pair of electrodes, which are the anode and cathode, and an active layer between the pair of electrodes. The photoelectric conversion element is configured such that either one of the electrodes is made from a transparent or translucent material, so that light will enter into an organic active layer from above the transparent or translucent electrode. By an energy (hv) of the light entered the organic active layer, electric charges (holes and electrons) are generated in the organic active layer, and the holes thus generated move toward the anode, whereas the electrons move toward the cathode. The electric charges are taken out of the element after reaching either the anode or the cathode.

The active layer having a phase-separated structure including a phase including an n-type semiconductor material (electron acceptor compound) and a phase including a p-type semiconductor material (electron donor compound) as a result of mixing the n-type semiconductor material and the p-type semiconductor material is referred to as bulk hetero junction-type active layer.

For example, applications of the photoelectric conversion element as a light detecting element to visible light communication systems or the like have been studied (see Non-Patent Document 1).

PRIOR ART DOCUMENTS

Non-Patent Document

Non-Patent Document 1: Sensors 2013, volume 13, issue 9, 12266-12276

SUMMARY OF THE INVENTION

Problems to be Solved by the Invention

However, the conventional photoelectric conversion element, especially as a light detecting element, has such a drawback that the conventional photoelectric conversion element is not yet sufficient in terms of detectivity (hereinafter, which may be referred to as "D*"). Thus, further improvement of the detectivity of the photoelectric conversion element has been demanded.

Means for Solving the Problems

As a result of diligent studies to solve the problem, the present inventors found that the problem can be solved by configuring such that a surface of the intermediate layer which is in contact with the active layer has a surface roughness having an absolute value within a certain range and a thickness of the active layer is within a certain range, thereby accomplishing the present invention. That is, the present invention provides the following [1] to [8].

[1] A photoelectric conversion element including a pair of electrodes, an active layer provided between the pair of electrodes, and an intermediate layer provided between the active layer and at least one of the pair of electrodes, in which the intermediate layer has a surface that is in contact with the active layer, the surface having a surface roughness having an absolute value greater than 0.22 nm but smaller than 1.90 nm, and in which the active layer is not less than 350 nm but not more than 800 nm in thickness.

[2] The photoelectric conversion element according to [1], in which the intermediate layer is an electron transport layer.

[3] The photoelectric conversion element according to [2], in which the electron transport layer includes a polyalkylene imine or a derivative thereof, or a metal oxide.

[4] The photoelectric conversion element according to [3], in which the electron transport layer includes a metal oxide including zinc.

[5] The photoelectric conversion element according to any one of [1] to [4], in which the surface roughness is in a range of 0.55 nm to 1.24 nm.

[6] The photoelectric conversion element according to any one of [1] to [5], in which the thickness of the active layer is not less than 400 nm but not more than 700 nm.

[7] The photoelectric conversion element according to any one of [1] to [6], being a light detecting element.

[8] The photoelectric conversion element according to any one of [1] to [7], in which the active layer includes an n-type semiconductor material and a p-type semiconductor material, and the n-type semiconductor material is fullerene or a fullerene derivative.

Effect of the Invention

According to the photoelectric conversion element of the present invention, the detectivity can be effectively improved.

MODE FOR CARRYING OUT THE INVENTION

Figure 1:
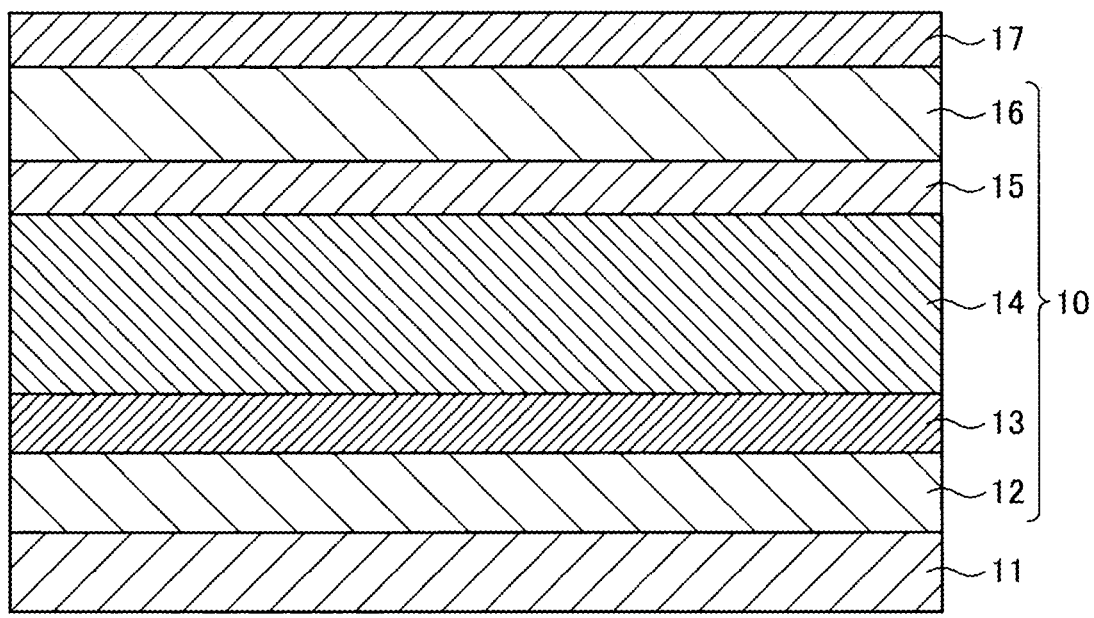
FIG. 1 is a view schematically illustrating a configuration example of a photoelectric conversion element.

In the following, a photoelectric conversion element according to one embodiment of the present invention will be described, referring to the drawings. It should be noted that the drawings are merely such schematic illustrations of the shapes, sizes, and arrangements of constituent elements that are just intended to make the present invention readily understandable. The present invention is not limited to the following descriptions, and each constituent element may be modified as appropriate within the gist of the present invention. Moreover, the configuration according to the embodiment of the present invention may be manufactured or used with an arrangement not illustrated in the drawings.

The terms commonly used in the explanation below will be explained.

What is meant by the "polymer compound" is a polymer having a molecular weight distribution and has a number average molecular weight (based on polystyrene) of not less than $1 \times 10^3$ but not more than $1 \times 10^8$. Structural units contained in the polymer compound amount 100 mol % in total.

What is meant by the "structural units" are units that are present in the polymer compound in such a way that the number of each of the units contained in the polymer compound is one or more.

A "hydrogen atom" may be a light hydrogen atom or a heavy hydrogen atom.

Examples of a "halogen atom" include a fluorine atom, a chlorine atom, a bromine atom, and an iodine atom.

An aspect described as "may be substituted" encompasses both of a case where all of hydrogen atoms constituting the compound or the group are unsubstituted, and a case where one or more of the hydrogen atoms are partially or wholly substituted with a substituent or substituents.

An "alkyl group" may be linear, branched, or cyclic, unless otherwise specified. The number of carbon atoms in the linear alkyl group, excluding the number of carbon atoms in the substituent(s), is generally in a range of 1 to 50, preferably in a range of 1 to 30, or more preferably in a range of 1 to 20. The number of carbon atoms in the branched or cyclic alkyl group, excluding the number of carbon atoms in the substituent(s), is generally in a range of 3 to 50, preferably in a range of 3 to 30, or more preferably in a range of 4 to 20.

The alkyl group may be substituted. Concrete examples of the alkyl group further include: alkyl groups such as methyl group, ethyl group, n-propyl group, isopropyl group, n-butyl group, an isobutyl group, tert-butyl group, n-pentyl group, isopentyl group, 2-ethylbutyl group, n-hexyl group, cyclohexyl group, n-heptyl group, cyclohexylmethyl group, cyclohexylethyl group, n-octyl group, 2-ethylhexyl group, 3-n-propylheptyl group, adamantyl group, n-decyl group, 3,7-dimethyloctyl group, 2-ethyloctyl group, 2-n-hexyldecyl group, n-dodecyl group, tetradecyl group, hexadecyl tomb, octadecyl group, and eicosyl group; and substituted alkyl group such as trifluoromethyl group, pentafluoroethyl group, perfluorobutyl group, perfluorohexyl group, perfluorooctyl group, 3-phenylpropyl group, 3-(4-methylphenyl) propyl group, 3-(3,5-di-n-hexylphenyl)propyl group, and 6-ethyloxylhexyl group.

What is meant by an "aryl group" is an atom group that is a residue of an aromatic hydrocarbon which may be substituted and from which one hydrogen atom directly bonding to a carbon atom constituting a ring is removed.

The aryl group may be substituted. Concrete examples of the aryl group include phenyl group, 1-naphthyl group, 2-naphthyl group, 1-anthracenyl group, 2-anthracenyl group, 9-anthracenyl group, 1-pyrenyl group, 2-pyrenyl group, 4-pyrenyl group, 2-fluorenyl group, 3-fluorenyl group, 4-fluorenyl group, 2-phenylphenyl group, 3-phenylphenyl group, 4-phenylphenyl group, and aryl groups substituted with an alkyl group(s), an alkoxy group(s), an aryl group(s), a fluorine atom(s) or the like.

An "alkoxy group" may be linear, branched, or cyclic. The number of carbon atoms in the linear alkoxy group, excluding the number of carbon atoms in the substituent(s), is generally in a range of 1 to 40, or preferably in a range of 1 to 10. The number of carbon atoms in the branched or cyclic alkoxy group, excluding the number of carbon atoms in the substituent(s), is generally in a range of 3 to 40, or preferably in a range of 4 to 10.

The alkoxy group may be substituted. Concrete examples of the alkoxy group include methoxy group, ethoxy group, n-propyloxy group, isopropyloxy group, n-butyloxy group, isobutyloxy group, tert-butyloxy group, n-pentyloxy group, n-hexyloxy group, cyclohexyloxy group, n-heptyloxy group, n-octyloxy group, 2-ethylhexyloxy group, n-nonyloxy group, n-decyloxy group, 3,7-dimethyloctyloxy group, and lauryloxy group.

The number of carbon atoms in an "aryloxy group," excluding the number of carbon atoms in the substituent(s), is generally in a range of 6 to 60, or preferably in a range of 6 to 48.

The aryloxy group may be substituted. Concrete examples of the aryloxy group include phenoxy group, 1-naphthyloxy group, 2-naphthyloxy group, 1-anthracenyloxy group, 9-anthracenyloxy group, 1-pyrenyloxy group, and aryloxy groups substituted with an alkyl group(s), an alkoxy group(s), a fluorine atom(s), or the like.

An "alkylthio group" may be linear, branched, or cyclic. The number of carbon atoms in the linear alkylthio group, excluding the number of carbon atoms in the substituent(s), is generally in a range of 1 to 40, or preferably in a range of 1 to 10. The number of carbon atoms in the branched and cyclic alkylthio group, excluding the number of carbon atoms in the substituent(s), is generally in a range of 3 to 40, or preferably in a range of 4 to 10.

The alkylthio group may be substituted. Concrete examples of the alkylthio group include methylthio group, ethylthio group, propylthio group, isopropylthio group, butylthio group, isobutylthio group, tert-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, and trifluoromethylthio group.

The number of carbon atoms in an "arylthio group," excluding the number of carbon atoms in the substituent(s), is generally in a range of 6 to 60, or preferably in a range of 6 to 48.

The arylthio group may be substituted. Examples of the arylthio group include phenylthio group, C1 to C12 alkyloxyphenylthio groups (here, the expression "C1 to C12" indicates that the groups recited right after the expression is such that the number of carbon atoms in the groups themselves is in a range of 1 to 12. The like expression hereinafter has the like meaning), C1 to C12 alkylphenylthio group, 1-naphtylthio group, 2-naphtylthio group, and pentafluorophenylthio group.

What is meant by a "p-valent heterocyclic group" (where p is an integer equal to or more than 1) is an atom group which is a residue of a heterocyclic compound that may be substituted and from which p ones of hydrogen atoms directly bonding to carbon atoms or a hetero atom(s) constituting the ring are removed. Among the p-valent heterocyclic group, "p-valent aromatic heterocyclic group" is preferable. What is meant by a "p-valent aromatic heterocyclic group" is an atom group which is a residue of an aromatic heterocyclic compound that may be substituted and from which p ones of hydrogen atoms directly bonding to carbon atoms or a hetero atom(s) constituting the ring are removed.

Examples of substituents that the heterocyclic compound may have include halogen atoms, alkyl group, aryl group, alkoxy group, aryloxy group, alkylthio group, arylthio group, monovalent heterocyclic groups, substituted amino group, acyl group, imine residue, amide group, acid imide group, substituted oxy carbonyl group, alkenyl group, alkynyl group, cyano group, and nitro group.

The aromatic heterocyclic compound encompasses compounds, whose heterocyclic ring itself is not aromatic but is fused with an aromatic ring(s), as well as compounds whose heterocyclic ring itself is aromatic.

Among the aromatic heterocyclic compounds, concrete examples of the compounds, whose heterocyclic ring itself is aromatic include oxadiazole, thiadiazole, thiazole, oxazole, thiophene, pyrrole, phosphole, furan, pyridine, pyrazine, pyrimidine, triazine, pyridazine, quinoline, isoquinoline, carbazole, and dibenzophoshole.

Among the aromatic heterocyclic compounds, concrete examples of the compounds, whose heterocyclic ring itself is not aromatic but is fused with an aromatic ring(s) include phenoxazine, phenothiazine, dibenzoborole, dibenzosilole, and benzopyran.

The number of carbon atoms in a monovalent heterocyclic group, excluding the number of carbon atoms in the substituent(s), is generally in a range of 2 to 60, or preferably in a range of 4 to 20.

The monovalent heterocyclic group may be substituted, and concrete examples of the monovalent heterocyclic group include thienyl group, pyrrolyl group, furyl group, pyridyl group, piperidyl group, quinolyl group, isoquinolyl group, pyrimidinyl group, triazinyl group, and monovalent heterocyclic groups substituted with an alkyl group(s), an alkoxy group(s), or the like.

What is meant by the "substituted amino group" is an amino group substituted with a substituent(s). The substituent(s) of the amino group may be preferably an alkyl group, an aryl group, or a monovalent heterocyclic group. The number of carbon atoms in the substituted amino group is generally in a range of 2 to 30.

Examples of the substituted amino group include: dialkylamino groups such as dimethylamino group and diethylamino group; and diarylamino group such as diphenylamino group, bis(4-methylphenyl)amino group, bis(4-tert-butylphenyl)amino group, and bis(3,5-di-tert-butylphenyl)amino group.

The number of carbon atoms in the "acyl group" is generally in a range of 2 to 20, or preferably 2 to 18. Concrete examples of the acyl group include acetyl group, propionyl group, butyryl group, isobutyryl group, pivaloyl group, benzoyl group, trifluoroacetyl group, and pentafluorobenzoyl group.

What is meant by the "imine residue" is an atom group which is a residue of an imine and from which one hydrogen atom directly bonding to the carbon atom or nitrogen atom constituting the carbon atom-nitrogen atom double bond is removed. What is meant by "imine compound" is an organic compound having a carbon atom-nitrogen atom double bond in its molecule. Examples of imine compound include a compound which is aldimine, ketimine, or aldimine in which one hydrogen atom bonding to the nitrogen atom constituting the carbon atom-nitrogen atom double bond is substituted with an alkyl group or the like.

The number of carbon atoms in the imine residue is generally in a range of 2 to 20, or preferably 2 to 18.

Examples of the imine residue include groups represented by the following structural formulae.

[Chem. 1]

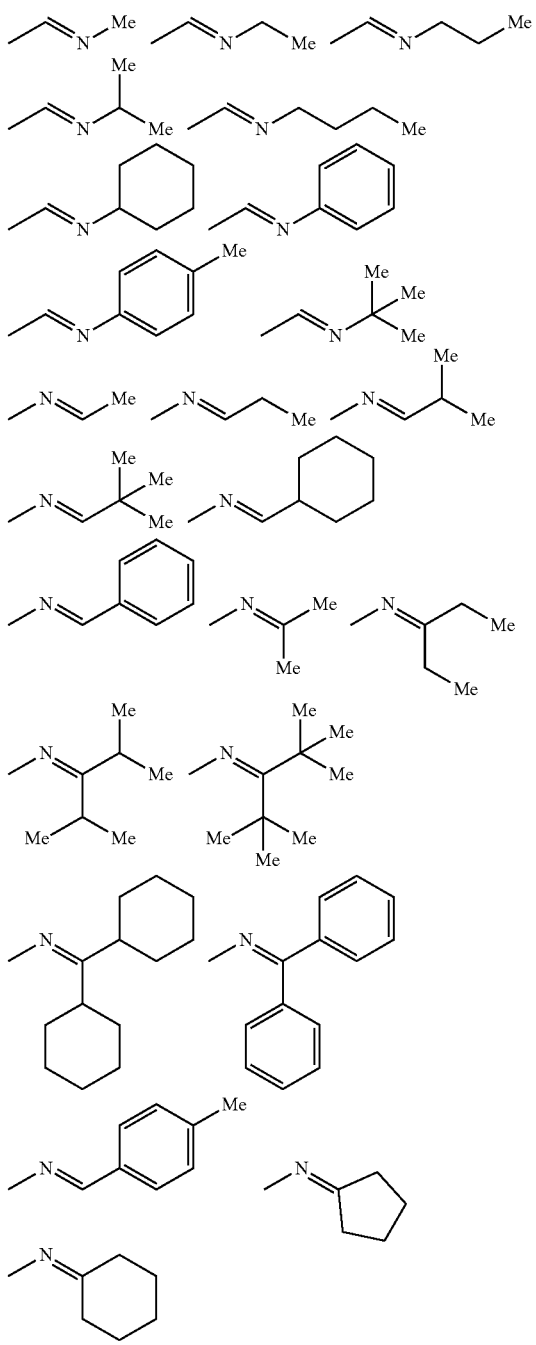

What is meant by the "amide group" is an atom group that is the residue of an amide from which one hydrogen atom bonding to the nitrogen atom is removed. The number of carbon atoms in the amide group is generally in a range of 1 to 20, or preferably in a range of 1 to 18. Concrete examples of the amide group include formamide group, acetoamide group, propioamide group, butyloaminde group, benzamide group, trifluoroacetoamide group, pentafluorobenzamide group, diformamide group, diacetoamide group, dipropioamide group, dibutyloamide group, dibenzamide group, ditrifluoroacetoamide group, and dipentafluorobenzamide group.

What is meant by the "acid imide group" is an atom group that is the residue of an acid imide from which one hydrogen atom bonding with the nitrogen atom is removed. The number of carbon atoms of the acid imide group is generally in a range of 4 to 20. Concreate examples of the acid imide group include groups represented by the following structural formulae.

[Chem. 2]

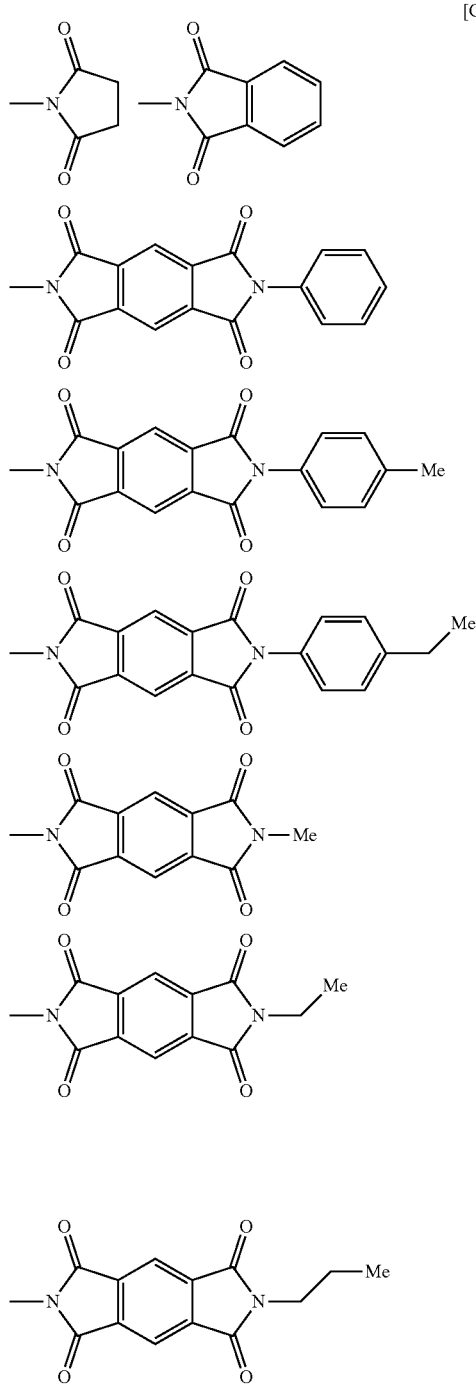

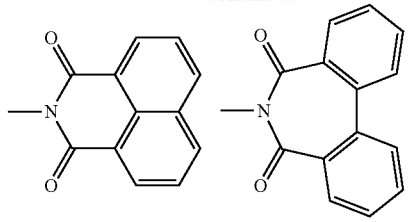

What is meant by the "substituted oxy carbonyl group" is a group represented by $R'$—O—(C=O)—. Here, $R'$ is an alkyl group, an aryl group, an arylalkyl group, or a monovalent heterocyclic group.

The number of carbon atoms of the substituted oxy carbonyl group is generally in a range of 2 to 60, or preferably 2 to 48.

Concrete examples of the substituted oxy carbonyl group include methoxy carbonyl group, ethoxy carbonyl group, propoxy carbonyl group, isoproxy carbonyl group, butoxy carbonyl group, isobutoxy carbonyl group, tert-butoxy carbonyl group, pentyloxy carbonyl group, hexyloxy carbonyl group, cyclohexyloxy carbonyl group, heptyloxy carbonyl group, octyloxy carbonyl group, 2-ethylhexyloxy carbonyl group, nonyloxy carbonyl group, decyloxy carbonyl group, 3,7-dimethyloctyloxy carbonyl group, dodecyloxy carbonyl group, trifluoromethoxy carbonyl group, pentafluoroethoxy carbonyl group, perfluorobutoxy carbonyl group, perfluorohexyloxy carbonyl group, perfluorooctyloxy carbonyl group, phenoxy carbonyl group, naphthoxy carbonyl group, and pyridyloxy carbonyl group.

An "alkenyl group" may be linear, branched, or cyclic. The number of carbon atoms in the linear alkenyl group, excluding the number of carbon atoms in the substituent(s), is generally in a range of 2 to 30, or preferably in a range of 3 to 20. The number of carbon atoms in the branched or cyclic alkenyl group, excluding the number of carbon atoms in the substituent(s), is generally in a range of 3 to 30, or preferably in a range of 4 to 20.

The alkenyl group may be substituted. Concreate examples of the alkenyl group include vinyl group, 1-propenyl group, 2-propenyl group, 2-butenyl group, 3-butenyl group, 3-pentenyl group, 4-pentenyl group, 1-hexenyl group, 5-hexenyl group, 7-octenyl group, and alkenyl groups substituted with an alkyl group(s), an alkoxy group(s), or the like.

An "alkynyl group" may be linear, branched, or cyclic. The number of carbon atoms in the linear alkenyl group, excluding the number of carbon atoms in the substituent(s), is generally in a range of 2 to 20, or preferably in a range of 3 to 20. The number of carbon atoms in the branched or cyclic alkenyl group, excluding the number of carbon atoms in the substituent(s), is generally in a range of 4 to 30, or preferably in a range of 4 to 20.

The alkynyl group may be substituted. Concrete examples of alkynyl group include ethynyl group, 1-propynyl group, 2-propynyl group, 2-butynyl group, 3-butynyl group, 3-pentynyl group, 4-pentynyl group, 1-hexynyl group, 5-hexynyl group, and alkynyl groups substituted with an alkyl group(s), an alkoxy group(s), or the like.

1. Photoelectric Conversion Element

A photoelectric conversion element (organic photoelectric conversion element) according to the present embodiment is a photoelectric conversion element which includes a pair of electrodes, an active layer provided between the pair of electrodes, and an intermediate layer provided between the active layer and at least one of the pair of electrodes, and is configured such that the intermediate layer has a surface in contact with the active layer, the surface having a surface roughness having an absolute value greater than 0.22 nm but smaller than 1.90 nm, and the active layer is not less than 200 nm but not more than 800 nm in thickness.

Examples of applications of the photoelectric conversion element according to the present embodiment include solar batteries and light detecting elements. The photoelectric conversion element according to the present embodiment is especially suitable as a light detecting element.

Here, a configuration example employable by a photoelectric conversion element according to the present embodiment will be described. FIG. 1 is a view schematically illustrating a photoelectric conversion element according to the present embodiment.

As illustrated in FIG. 1, a photoelectric conversion element 10 is provided on a support substrate 11, and includes a cathode 12 provided in contact with the support substrate 11, an electron transport layer 13 provided in contact with the cathode 12, an active layer 14 provided in contact with the electron transport layer 13, a hole transport layer 15 provided in contact with the active layer 14, and an anode 16 provided in contact with the hole transport layer 15. In this configuration example, a sealing member 17 is provided on the anode 16 in such a way that the sealing member 17 is in contact with the anode 16. Hereinafter, a constituent element that may be included in the photoelectric conversion element according to the present embodiment will be described in more detail.

(Substrate)

The photoelectric conversion element is generally formed on a substrate (support substrate). On this substrate, a pair of electrodes including the cathode and the anode are formed in general. A material of the substrate is not particularly limited, as long as the material will not be chemically changed especially in forming a layer containing an organic compound.

Examples of the material of the substrate include glass, plastic, polymer films, and silicon. If the substrate is opaque, it is preferable that the electrode opposite to the electrode closer to the opaque substrate be transparent or translucent (that is, the electrode farther to the opaque electrode be transparent or translucent).

(Electrode)

The photoelectric conversion element includes a pair of the anode and the cathode. It is preferable that at least one of the anode and the cathode be transparent or translucent, so that light can enter therethrough into the photoelectric conversion element.

Examples of transparent or translucent materials of the electrodes include electrically conductive metal oxide films, translucent metal thin films, and the like. Specific examples include: indium oxide, zinc oxide, tin oxide, and a complex of these such as indium tin oxide (ITO) and indium zinc oxide (IZO); electrically conductive materials such as NESA; and gold, platinum, silver, and copper. As the material of the transparent or translucent electrode, ITO, IZO, and tin oxide are preferable. Moreover, as the electrode, a transparent conductive film whose material is an organic compound such as polyaniline or a derivative thereof, or polythiophene or derivative thereof, may be used. The transparent or translucent electrode may be the anode or the cathode.

As long as one of the pair of the electrodes is transparent or translucent, the other one of the electrodes may be an electrode low in light transparency. Examples of a material of the electrode low in light transparency include metals and electrically conductive polymers. Concrete examples of such a material of the electrode low in light transparency include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, alloys of two or more kinds of them, alloys of at least one of them and at least one kind of metal selected from the group consisting of gold, silver, platinum, copper, manganese, titanium, cobalt, nickel, tungsten, and tin, graphite, graphite intercalation compounds, polyaniline and derivatives thereof, and polythiophene and derivatives thereof. Examples of the alloys include magnesium-silver alloy, magnesium-indium alloy, magnesium-aluminum alloy, indium-silver alloy, lithium-aluminum alloy, lithium-magnesium alloy, lithium-indium alloy, and calcium-aluminum alloy.

A forming method of the electrodes may be a conventional and well-known method selected arbitrarily and appropriately. Examples of the forming method of the electrodes include a vacuum deposition method, a sputtering method, an ion plating method, and a plating method.

(Active Layer)

The active layer includes a p-type semiconductor material (electron donor compound) and an n-type semiconductor material (electron acceptor compound) (details of suitable p-type semiconductor materials and n-type semiconductor materials will be described later). Whether the p-type semiconductor material or the n-type semiconductor material is selected can be relatively determined from the energy levels of the HOMO or LUMO of the compounds selected.

In the present embodiment, it is preferable that the thickness of the active layer be 350 nm or thicker, for the sake of leakage current (dark current) that occurs under no light radiation. On the other hand, an excessively thick thickness of the active layer would make it difficult to collect a current (light current) that occurs under light radiation. Thus, it is preferable that the thickness of the active layer be 800 nm or less. For the sake of taking a good balance between the dark current and light current, it is more preferable that the thickness of the active layer be not less than 400 nm but not more than 700 nm.

By adjusting the thickness of the active layer within the ranges, it becomes possible to alleviate reduction of the light current while facilitating reduction of the dark current, thereby making it possible to further improve the detectivity consequently.

(Intermediate Layer)

As illustrated in FIG. 1, the photoelectric conversion element according to the present embodiment may preferably include an intermediate layer such as a charge transport layer (an electron transport layer, a hole transport layer, an electron injection layer, a hole injection layer) as a constituent element for providing a better property, such as a photoelectric conversion efficiency In the present embodiment, an absolute value of the surface roughness of that surface of the intermediate layer which is in contact with the active layer may be preferably a value greater than 0.22 nm but smaller than 1.90 nm, more preferably a value not less than 0.33 nm but not more than 1.50 nm, or further preferably a value not less than 0.55 nm but not more than 1.24 nm, for the sake of improving the detectivity.

A material of such an intermediate layer may be, for example, a conventional and well-known material arbitrarily and appropriately selected, which facilitates electric charge transport within the layers constituting the photoelectric conversion element. Examples of the material of the intermediate layer include halides of alkali metals or alkali earth metals such as lithium fluoride, and oxides such as molybdenum oxide.

Moreover, example of the material of the intermediate layer include fine particles of inorganic oxide semiconductor materials such as titanium oxide, zinc oxide and the like, and a mixture of PEDOT (poly(3,4-ethylenedioxythiophene)) and PSS (poly(4-styrenesulfonate)) (PEDOT:PSS).

As illustrated in FIG. 1, the photoelectric conversion element according to the present embodiment may preferably include an electron transport layer between the cathode and the active layer as the intermediate layer. The electron transport layer has a function of transporting electrons from the active layer to the cathode. The electron transport layer may be in contact with the cathode. The electron transport layer may be in contact with the active layer.

The electron transport layer provided in contact with the cathode may be referred to as an electron injection layer, especially. The electron transport layer (electron injection layer) provided in contact with the cathode has a function of facilitating the injection of the electron generated in the active layer into the cathode.

The electron transport layer includes an electron transport material. Examples of the electron transport material include polyalkylene imines and derivatives thereof, polymer compounds having a fluorene structure, and metal oxides.

The electron transport layer may preferably contain a polyalkylene imine or a derivative thereof, or a metal oxide.

Examples of polyalkylene imines and derivatives thereof include alkylene imines with the number of carbon atoms in a range of 2 to 8 such as ethylene imine, propylene imine, butylene imine, dimethyl ethylene imine, pentylene imine, hexylene imine, heptylene imine, and octylene imine, and especially polymers obtainable by polymerizing, by an ordinary method in the field, one or two or more of alkylene imines with the number of carbon atoms in a range of 2 to 4, and polymers obtainable by chemically modifying such a polymer by reaction with a compound of various kinds. As the polyalkylene imines and derivatives thereof, polyethylene imine (PEI) and ethoxylated polyethyleneimine (PEIE).

Examples of the polymer compound having a fluorene structure include poly[(9,9-bis(3'-(N,N-dimethylamino)propyl)-2,7-fluorene)-o-2,7-(9,9'-dioctyl fluorene)](PFN) and PFN-P2.

Examples of the metal oxides include zinc oxide, gallium-doped zinc oxide, aluminum-doped zinc oxide, titanium oxide, and niobium oxide. As the metal oxides, metal oxides including zinc are preferable, and of such metal oxides, zinc oxide is preferable.

Examples of electron transport material other than above include poly(4-vinylphenol), and perylene diimide.

In the present embodiment, an absolute value of the surface roughness of that surface of the electron transport layer (electron injection layer) which is in contact with the active layer may be preferably a value greater than 0.22 nm but smaller than 1.90 nm, more preferably a value not less than 0.33 nm but not more than 1.50 nm, or further preferably a value not less than 0.55 nm but not more than 1.24 nm.

With the configuration in which the absolute value of the surface roughness of that surface of the electron transport layer which is in contact with the active layer is within the range mentioned above, it is possible to more effectively gather the electrons into the electron transport layer from the active layer, thereby facilitating further improvement of external quantum efficiency (EQE), thereby consequently making it possible to further improve the detectivity.

Here, more specifically, what is meant by EQE is a value indicating, as percentage (%), the number of electrons taken out of the photoelectric conversion element among the generated electrons with respect to the number of photons absorbed by the photoelectric conversion element.

As illustrated in FIG. 1, the photoelectric conversion element may include the hole transport layer between the anode and the active layer. The hole transport layer has a function of transporting the holes from the active layer to the electrode.

The hole transport layer provided in contact with the anode may be referred to as a hole injection layer, especially. The hole transport layer (hole injection layer) provided in contact with the anode has a function of injecting the holes into the anode. The hole transport layer (hole injection layer) may be in contact with the active layer.

The hole transport layer includes the hole transport material. Examples of the hole transport material include polythiophene and derivatives thereof, aromatic amine compounds, polymer compounds including a structural unit including an aromatic amine residue, CuSCN, CuI, NiO, and molybdenum oxide ($MoO_3$).

The intermediate layer may be formed by a coating method similar to that for the forming method of the active layer described above.

The photoelectric conversion element according to the present embodiment may be preferably configured such that the intermediate layer is the electron transport layer and the photoelectric conversion element has a structure in which the substrate (support substrate), the cathode, the electron transport layer, the active layer, and the anode are laminated on one another in a contact manner in this order.

(Sealing Member)

The photoelectric conversion element according to the present embodiment may be configured as such an aspect that the photoelectric conversion element is sealed with a sealing member. Examples of the sealing member include a combination of a sealing substrate being a cover glass member with a recess, and a sealing material.

The sealing member may be a sealing layer having a layer structure having one or more layers. Examples of the layer(s) constituting the sealing layer include a gas barrier layer, and a gas barrier film.

It is preferable that the sealing layer is formed from a material having a moisture blocking property (moisture barrier property) or an oxygen blocking property (oxygen barrier property). Suitable examples of the material of the sealing layer include: organic materials such as a resin made of polytrifluoroethylene, polychlorotrifluoroethylene (PCTFE), polyimide, polycarbonate, polyethylene terephthalate, alicyclic polyolefin, and ethylene-vinyl alcohol copolymer; and inorganic materials such as silicon oxide, silicon nitride, aluminum oxide, and diamond-like carbon.

(Applications of Photoelectric Conversion Element)

The photoelectric conversion element according to the present embodiment is capable of flowing a photocurrent when light is radiated thereon from above the transparent or translucent electrode while a voltage (reverse bias voltage) is being applied between the electrodes, thereby being operable as a light detecting element (light sensor). Moreover, a plurality of such light sensors integrated together can be used as an image sensor.

Moreover, the photoelectric conversion element according to the present embodiment is capable of generating a photovoltaic power between the electrodes, thereby being operable as a solar cell. A plurality of such solar cells integrated together can form a solar cell module.

(Application Examples of Photoelectric Conversion Element)

The photoelectric conversion element according to the present embodiment of the present invention as described above are suitably applicable to detecting sections provided to various electronic devices such as work stations, personal computers, portable information terminals, room entry-exit management systems, digital cameras, and medical devices.

The photoelectric conversion element (light detecting element) of the present invention is suitably applicable to detecting sections provided on the electronic devices exemplified above, such as image detecting sections (image sensor) of solid-state image capturing devices such as X-ray image capturing devices and CMOS image sensors, detecting sections for detecting a certain feature of a living body such as a fingerprint detecting section, a face detecting section, a vein detecting section, and an iris detecting section, and detecting sections of optical bio sensors such as pulse oxymeters.

In the following, among the detecting sections to which the photoelectric conversion element according to the present embodiment of the present invention is suitably applicable, configuration examples of the image detecting section of the solid-state image capturing device and the fingerprint detecting section for a biometric authentication device (fingerprint authentication device) will be described, referring to drawings.

(Image Detecting Section)

Figure 2:
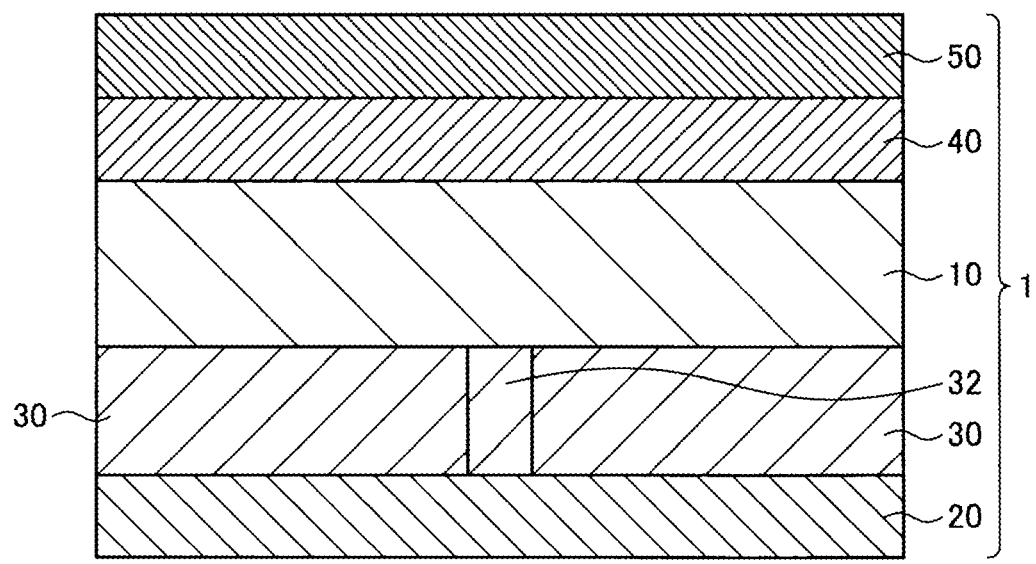
FIG. 2 is a view schematically illustrating a configuration example of an image detecting section.

FIG. 2 is a view schematically illustrating a configuration example of an image detecting section of a solid-state image capturing device.

An image detecting section 1 includes a CMOS transistor substrate 20, an interlayer insulating film 30 provided to cover the CMOS transistor substrate 20, a photoelectric conversion element 10 according to the present embodiment of the present invention provided on the interlayer insulating film 30, an interlayer wiring section 32 provided through the interlayer insulating film 30 and configured to electrically connecting the CMOS transistor substrate 20 and the photoelectric conversion element 10, a sealing layer 40 provided to cover the photoelectric conversion element 10, and a color filter 50 provided on the sealing layer 40.

The CMOS transistor substrate 20 has a conventional and well-known structure selected arbitrarily and appropriately and configured in a manner that is in conformity with a design of the image detecting section 1.

The CMOS transistor substrate 20 includes transistors, capacitors, and the like formed within a thickness of the substrate, and functional elements such as CMOS transistor circuits (MOS transistor circuits) for realizing various functions.

Examples of the functional elements include floating diffusion, reset transistors, output transistors, and selecting transistors.

The CMOS transistor substrate 20 is configured such that a signal reading circuit and the other circuits are formed with these functional elements, wirings, and the like.

The interlayer insulating film 30 may be formed with a conventional and well-known insulating material selected arbitrarily and appropriately, such as silicon oxide, and insulating resin. The interlayer wiring section 32 may be formed from a conventional and well-known electrically conductive material (wiring material) selected arbitrarily and appropriately such as copper or tungsten. The interlayer wiring section 32 may be, for example, an in-hole wiring formed at the same time as the formation of a wiring layer, or an embedded plug formed not at the same time as the formation of a wiring layer.

The sealing layer 40 may be formed from any conventional and well-known material selected arbitrarily and appropriately, provided that the material can prevent or reduce penetration of harmful materials such as oxygen and water, which would possibly deteriorate the photoelectric conversion element 10 functionally. The sealing layer 40 may be configured in a manner similar to the sealing member 17 described above.

The color filter 50 may be, for example, a primary color filter formed from any conventional and well-known material selected arbitrarily and appropriately, and configured as an aspect in conformity with the design of the image detecting section 1. Moreover, the color filter 50 may be a complementary color filter that can be thinner than such a primary color filter. The complementary color filter may be a color filter having, for example, a combination of three colors of yellow, cyan, and magenta, a combination of three colors of yellow, cyan, and transparent, a combination of three colors of yellow, transparent, and magenta, and a combination of three colors of transparent, cyan, and magenta. These can be positioned arbitrarily and appropriately according to the design of the photoelectric conversion element 10 and CMOS transistor substrate 20, provided that color image data can be generated.

The photoelectric conversion element 10 receives light via the color filter 50, converts the light into an electric signal according to a light amount of the light thus received, and outputs the electric signal via an electrode to outside of the photoelectric conversion element 10 as a received light signal, which is, an electric signal corresponding to a target object of image capturing.

Next, the received light signal outputted from the photoelectric conversion element 10 is inputted into the CMOS transistor substrate 20 via the interlayer wiring section 32, read out by a signal reading circuit fabricated on the CMOS transistor substrate 20, and subjected to a signal process by a conventional and well-known functional section (not illustrated) arbitrarily and appropriately selected, thereby to generate image information on the basis of the target object of image capturing.

(Fingerprint Detecting Section)

Figure 3:
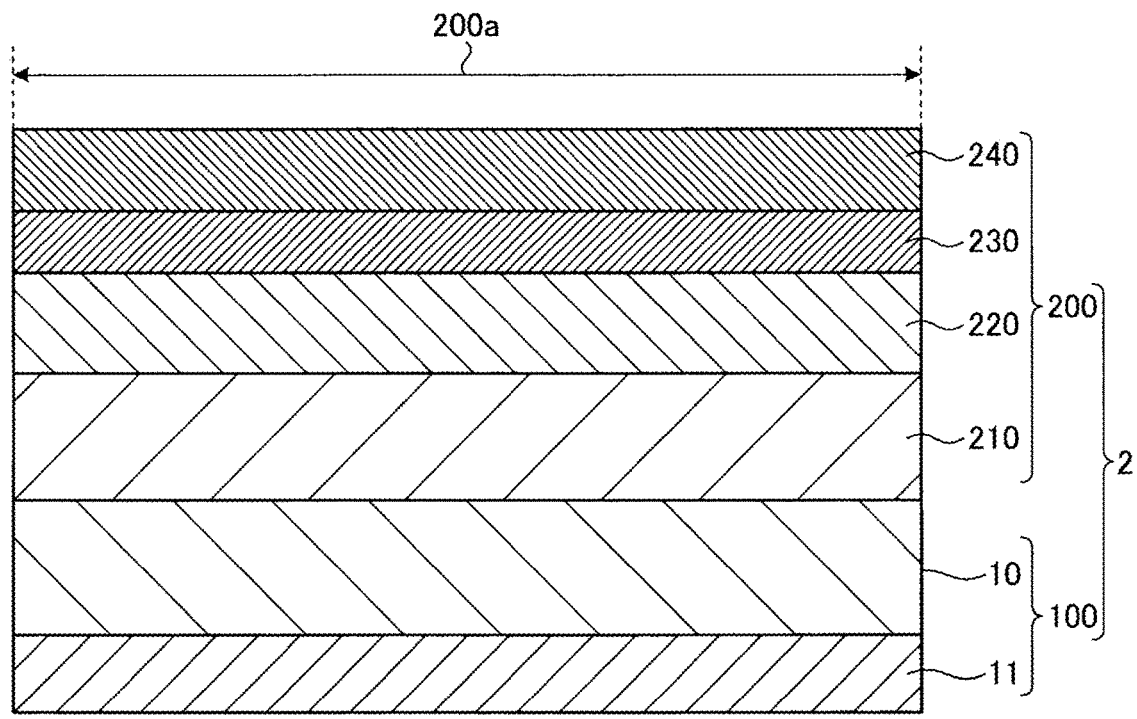
FIG. 3 is a view schematically illustrating a configuration example of a fingerprint detecting section.

FIG. 3 is a view schematically illustrating a configuration example of a fingerprint detecting section integrated with a display device.

A display device 2 of a portable information terminal includes a fingerprint detecting section 100 including a photoelectric conversion element 10 according to the present embodiment of the present invention as a main constituent element thereof, and a display panel section 200 provided on the fingerprint detecting section 100 and configured to display a predetermined image.

In this configuration example, the fingerprint detecting section 100 is provided in a region substantially matching with a display region 200a of the display panel section 200. That is, the display panel section 200 is laminated on the fingerprint detecting section 100 integrally.

In case where fingerprint detection is performed only in a partial region of the display region 200a, the fingerprint detecting section 100 may be provided only in the partial region.

The fingerprint detecting section 100 may include the photoelectric conversion element 10 according to the present embodiment of the present invention as a functional section configured to perform a main function of fingerprint detecting section 100. The fingerprint detecting section 100 may include any conventional and well-known member selected arbitrarily and appropriately such as a protection film (not illustrated), a support substrate, a sealing substrate, a sealing member, a barrier film, a band pass filter, or an infrared ray cut-off film, in a manner configured according to such a design to attain a desired property. The fingerprint detecting section 100 may employ the configuration of the image detecting section described above.

The photoelectric conversion element 10 may be included in an arbitrary manner in the display region 200a. For example, a plurality of the photoelectric conversion elements 10 may be provided in matrix.

The photoelectric conversion element 10 is provided on the support substrate 11 as described above. On the support substrate 11, for example, an electrode (anode or cathode) is provided in matrix.

The photoelectric conversion element 10 receives light, converts the light into an electric signal according to a light amount of the light thus received, and outputs the electric signal via an electrode to outside of the photoelectric conversion element 10 as a received light signal, which is, an electric signal corresponding to a fingerprint image captured.

In this configuration example, the display panel section 200 is configured as an organic electroluminescence display panel (organic EL display panel) including a touch sensor panel. The display panel section 200 may be configured, for example, as any conventional and well-known display panel selected arbitrarily and appropriately such as a liquid crystal display panel having a light source such as a backlight, instead of the organic EL display panel.

The display panel section 200 is provided on the fingerprint detecting section 100 described above. The display panel section 200 includes an organic electroluminescence element (organic EL element) 220 as a functional section for performing a main function. The display panel section 200 may further include any conventional and well-known member selected arbitrarily and appropriately such as a substrate such as a conventional and well-known glass substrate selected arbitrarily and appropriately (a support substrate 210 or a sealing substrate 240), a sealing member, a barrier film, a polarizer such as a circular polarizer, or a touch sensor panel 230, in a manner configured in conformity with a desired property.

In the configuration example described above, the organic EL element 220 is used as a light source for pixels in the display region 200a and as a light source for capturing an image of a fingerprint by the fingerprint detecting section 100.

Here, an operation of the fingerprint detecting section 100 will be briefly described. In performing fingerprint authentication, the fingerprint detecting section 100 detects a fingerprint by using light emitted from the organic EL element 220 of the display panel section 200. More specifically, the light emitted from the organic EL element 220 passes intermediate constituent elements provided between the organic EL element 220 and the photoelectric conversion element 10 of the fingerprint detecting section 100, and is reflected on a skin (finger surface) of a fingertip of a hand finger placed in contact with a surface of the display panel section 200 in the display region 200a. At least part of the light reflected on the finger surface passes the intermediate constituent elements, and is received by the photoelectric conversion element 10 and converted into electric signals by the photoelectric conversion element 10 according to amounts of received light received by the photoelectric conversion element 10. Then, from the electric signals thus converted, image information of the fingerprint on the finger surface is formed.

The portable information terminal provided with the display device 2 performs fingerprint authentication by comparing the image information thus obtained with pre-recorded fingerprint data for the fingerprint authentication, by performing conventional and well-known steps selected arbitrarily and appropriately.

According to the photoelectric conversion element of the present invention, the improvement of the external quantum efficiency and the reduction of the dark current are both achieved by configuring such that the surface roughness of the electron transport layer is adjusted within the certain range and the thickness of the active layer is adjusted within the certain range, thereby making it possible to effectively improve the detectivity consequently.

2. Manufacturing Method of Photoelectric Conversion Element

A manufacturing method of the photoelectric conversion element according to the present embodiment is not particularly limited. The photoelectric conversion element may be manufactured by a combination of forming methods suitable for the materials selected for forming the constituent elements.

The manufacturing method of the photoelectric conversion element includes a step of forming an intermediate layer having a surface that is/to be in contact with the active layer and that has a surface roughness having an absolute value greater than 0.22 nm but smaller than 1.90 nm, and a step of forming the active layer having a thickness not less than 200 nm but not more than 800 nm.

Hereinafter, as one embodiment of the present invention, a manufacturing method of a photoelectric conversion element having such a configuration that a substrate (support substrate), a cathode, an electron transport layer, an active layer, a hole transport layer, and an anode are laminated on one another in a contact manner in this order will be described below.

(Step of Preparing a Substrate)

In this step, a support substrate on which a cathode is provided is prepared. A method of providing the cathode on the support substrate is not particularly limited. The cathode may be formed on the support substrate, for example, by coating a material exemplified as the material by a vacuum deposition method, a sputtering method, an ion plating method, a plating method, or the like, the support substrate being made from a material described above.

Moreover, the support substrate on which the cathode is provided can be prepared by obtaining a commercially-available substrate with an electrically conductive thin film thereof formed from a material of the electrode described above, and if necessary, fabricating the cathode by patterning the electrically conductive thin film.

(Step of Forming the Electron Transport Layer)

A manufacturing method of the photoelectric conversion element may include a step of forming an electron transport layer (electron injection layer) provided between the active layer and the cathode.

More specifically, the manufacturing method of the photoelectric conversion element according to the present embodiment further includes the step of forming the electron transport layer after the step of preparing the support substrate with the cathode formed thereon and before the step of forming the active layer.

A method of forming the electron transport layer is not particularly limited. For the sake of further simplifying the step of forming the electron transport layer and adjusting the surface roughness to a predetermined value (to be within a predetermined range), it is preferable to form the electron transport layer by a coating method. That is, it is preferable to form the electron transport layer by, before the formation of the active layer and after the formation of the cathode, coating a coating liquid on the cathode, the coating liquid containing an electron transport material described later and a solvent, and if necessary, removing the solvent by performing drying treatment (heating treatment).

The electron transport material for forming the electron transport layer may be an organic compound or an inorganic compound.

The electron transport material being an organic compound may be a low-molecular weight organic compound or a high-molecular weight organic compound.

Examples of the electron transport material being a low-molecular weight organic compound include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes and derivatives thereof such as CH fullerene, and phenanthrene derivatives such as bathocuproine.

Examples of the electron transport material being a high-molecular weight organic compound include polyvinyl carbazole and derivatives thereof, polysilane and derivatives thereof, polysiloxane derivatives having an aromatic amine structure in their side chain or main chain, polyaniline and derivatives thereof, polythiophene and derivatives thereof, polypyrrole and derivatives thereof, polyphenylene vinylene and derivatives thereof, and polythienylene vinylene and derivatives thereof, polyfluorene and derivatives thereof, and the like.

Examples of the electron transport material being an inorganic compound include zinc oxide, titanium oxide, zirconium oxide, tin oxide, indium oxide, GZO (gallium-doped zinc oxide, ATO (antimony-doped tin oxide), and AZO (aluminum-doped zinc oxide). Among them, zinc oxide, gallium-doped zinc oxide, and aluminum doped-zinc oxide are preferable. In forming the electron transport layer, it is preferable that the electron transport layer be formed by using a coating liquid containing particles of zinc oxide, gallium-doped zinc oxide, or aluminum-doped zinc oxide. As such an electron transport material, it is preferable to use nano particles of zinc oxide, nano particles of gallium-doped zinc oxide, or nano particles of aluminum-doped zinc oxide. It is more preferable to form the electron transport layer from an electron transport material consisting of only the nano particles of zinc oxide, the nano particles of gallium-doped zinc oxide, or the nano particles of aluminum-doped zinc oxide.

An average particle size of the nano particles of zinc oxide, the nano particles of gallium-doped zinc oxide, or the nano particles of aluminum-doped zinc oxide as sphere equivalent diameter is preferably in a range of 1 nm to 1000 nm, or more preferably in a range of 10 nm to 100 nm. The average particle size can be measured, for example, by laser light scattering method, X-ray diffraction method, or the like.

In the manufacturing method of the photoelectric conversion element according to the present invention, it is preferable that the step of forming the electron transport layer includes coating a coating liquid containing PEIE, perylene diimide, PFN or PFN-P2 in order to form the electron transport layer.

Examples of the solvent included in the coating liquid including the electron transport material include water, alcohols, ketones, hydrocarbons, and the like. Concrete examples of the alcohols include methanol, ethanol, isopropanol, butanol, ethylene glycol, propylene glycol, butoxy ethanol, methoxy butanol, and the like. Concrete examples of ketones include acetone, methyl ethyl ketone, methyl isobutyl ketone, 2-heptanone, cyclohexanone, and the like. Concrete examples of the hydrocarbons include n-pentane, cyclohexane, n-hexane, benzene, toluene, xylene, tetralin, chlorobenzene, o-dichlorobenzene, and the like. The coating liquid may include only one type of solvent or two or more types of solvents, and may include two or more types of the solvents mentioned above.

The coating liquid for use in the coating method for forming the electron transport layer may be a dispersion such as an emulsion (emulsion), or a suspension (suspension). The coating liquid may be preferably a coating liquid that would not give a significant damage to the layer on which the coating liquid is applied (such as the active layer or the other layer), and more specifically, the coating liquid may be preferably a coating liquid that is difficult to dissolve the layer on which the coating liquid is applied (such as the active layer or the other layer).

With the configuration in which the step of forming the electron transport layer is carried out by the coating method and the size (the particle size, the molecular weight (in case of a polymer compound), or the like) of the electron transport material used is adjusted as appropriate, the surface roughness of the electron transport layer can be adjusted to be within an appropriate range arbitrarily. Moreover, if the coating method is the spin coating method, the conditions of performing the spin coating method such as the properties of the coating liquid such as the concentration of components in the coating liquid used (viscosity of the coating liquid), rotation speed of the spinning, rotation time, and drying (heating) conditions can be adjusted to adjust the surface roughness of the electron transport layer to be within an appropriate range arbitrarily.

More specifically, by increasing the dilution ratio of the coating liquid with the solvent, it is possible to further increase the surface roughness of that surface of, for example, the electron transport layer as the intermediate layer which is to be in contact with the active layer. By decreasing the dilution ratio of the coating liquid with the solvent, it is possible to further decrease the surface roughness of that surface of the electron transport layer which is to be in contact with the active layer.

The surface roughness of the other intermediate layers such as the hole transport layer formable by the coating method can be adjusted to be within an appropriate range arbitrarily by a similar method. By employing a laminate structure in which the active layer is formed on the surface of the intermediate layer whose surface roughness is adjusted as such, it is possible to attain the advantageous effect of the present invention described above.

(Step of Forming the Active Layer)

The active layer, which is a main constituent of the photoelectric conversion element according to the present embodiment can be manufactured by a coating method using a coating liquid (ink).

In the following, the step (i) and the step (ii) included in the forming method of the active layer which is a main constituent of the photoelectric conversion element of the present invention will be described.

Step (i) The method of coating the coating liquid on the coating target may be a coating method selected arbitrarily and appropriately. The coating method may be preferably a slit coating method, a knife coating method, a spin coating method, a microgravure coating method, a gravure coating method, a bar coating method, an inkjet printing method, a nozzle coating method, or a capillary coating method, more preferably the slit coating method, the spin coating method, the capillary coating method, or the bar coating method, or further preferably the slit coating method or the spin coating method.

The coating liquid for forming the active layer is applied on the coating target selected according to the photoelectric conversion element and the manufacturing method thereof. The process for manufacturing the photoelectric conversion element may be such that the coating liquid for forming the active layer may be applied on a functional layer which the photoelectric conversion element has and in which the active layer may exist. Thus, the coating target of the coating liquid for forming the active layer may vary depending on a layer configuration of layers of the photoelectric conversion element to be manufactured and the order of forming the layers. For example, in case where the photoelectric conversion element has a layer configuration of substrate, anode, hole transport layer, active layer, electron transport layer, and cathode thus laminated, and the layers are formed in the order of from the rightmost layer to the leftmost layer, the coating target of the coating liquid for forming the active layer is the electron transport layer. For example, in case where the photoelectric conversion element has a layer configuration of substrate, cathode, electron transport layer, active layer, hole transport layer, and anode thus laminated, and the layers are formed in the order of from the rightmost layer to the leftmost layer, the coating target of the coating liquid for forming the active layer is the hole transport layer.

Step (ii) As a method of removing the solvent from the coated film of the coating liquid, that is, a method of solidifying the coating film by removing the solvent from the coated film may be any method as appropriate. Examples of the method of removing the solvent include drying methods such as a method of directly heating by using a hot plate, a hot-air drying method, an infrared ray heating drying method, a flush lamp annealing drying method, and a reduced pressure drying method.

The thickness of the active layer can be adjusted to a desired thickness by appropriately changing the solid content in the coating liquid, the conditions of the step (i) and/or the step (ii).

More specifically, for example, if the coating method is the spin coating method, the conditions of performing the spin coating method such as the properties of the coating liquid such as the concentration of components in the coating liquid used (viscosity of the coating liquid), rotation speed of the spinning coating method, and rotation time, can be adjusted to adjust the thickness of the active layer appropriately and arbitrarily.

For example, in order to adjust the thickness of the active layer to be thicker, the concentration of the components in the coating liquid is increased, and/or the rotation speed of the spin coating method is lowered.

The step of forming the active layer may further include a step other than the step (i) and the step (ii), as long as the other step will not act against the object and effect of the present invention.

The manufacturing method of the photoelectric conversion element may be a method of manufacturing a photoelectric conversion element including a plurality of active layers, and may include repeating the step (i) and the step (ii) plural times.

The coating liquid for forming the active layer may be a solution, or a dispersion liquid such as a dispersion, an emulsion (emulsion), or a suspension (suspension). The coating liquid of the present embodiment is a coating liquid for forming the active layer, and includes the p-type semiconductor material, an n-type semiconductor material, and a solvent. In the following, the components of the coating liquid for forming the active layer will be described.

(p-Type Semiconductor Material)

The p-type semiconductor material may be a low-molecular weight compound or a high-molecular weight compound.

Examples of the p-type semiconductor material being a low-molecular weight compound include phthalocyanine, metal phthalocyanine, porphyrin, metal porphyrin, oligothiophene, tetracene, pentacene, and rubrene.

In case where the p-type semiconductor material is a high-molecular weight compound, the high-molecular weight compound has a certain weight average molecular weight based on polystyrene.

Here, what is meant by the weight average molecular weight based on polystyrene is a weight average molecular weight worked out by using gel permeation chromatography (GPC) with polystyrene used as a control sample.

The weight average molecular weight of the p-type semiconductor material based on polystyrene may be preferably not less than 20000 but not more than 200000, more preferably not less than 30000 but not more than 180000, or further preferably not less than 40000 but not more than 150000, for the sake of solubility into the solvent.

Examples of the p-type semiconductor material being the polymer compound include polyvinyl carbazole and derivatives thereof, polysilane and derivatives thereof, polysiloxane derivatives having an aromatic amine structure in their side chain or main chain, polyaniline and derivatives thereof, polythiophene and derivatives thereof, polypyrrole and derivatives thereof, polyphenylene vinylene and derivatives thereof, and polythienylene vinylene and derivatives thereof, polyfluorene and derivatives thereof, and the like.

The p-type semiconductor material being the polymer compound may be preferably a polymer compound having a structural unit having a thiophene skeleton.

The p-type semiconductor material may be preferably a polymer compound having a structural unit represented by the following formula (I) and/or a structural unit represented by the following formula (II).

[Chem. 3]

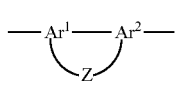
(I)

In the formula (I), $Ar^1$ and $Ar^2$ are trivalent aromatic heterocyclic groups, and Z is a group represented by formulae (Z-1) to (Z-7).

[Chem. 4]

(II)

In the formula (II), $Ar^3$ is a divalent aromatic heterocyclic group.

[Chem. 5]

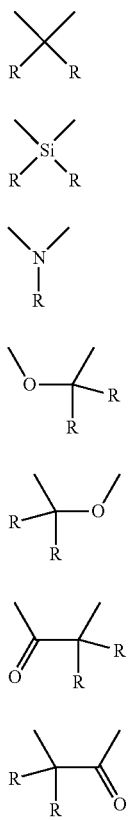

(Z-1)
(Z-2)
(Z-3)
(Z-4)
(Z-5)
(Z-6)
(Z-7)

[Chem. 7]

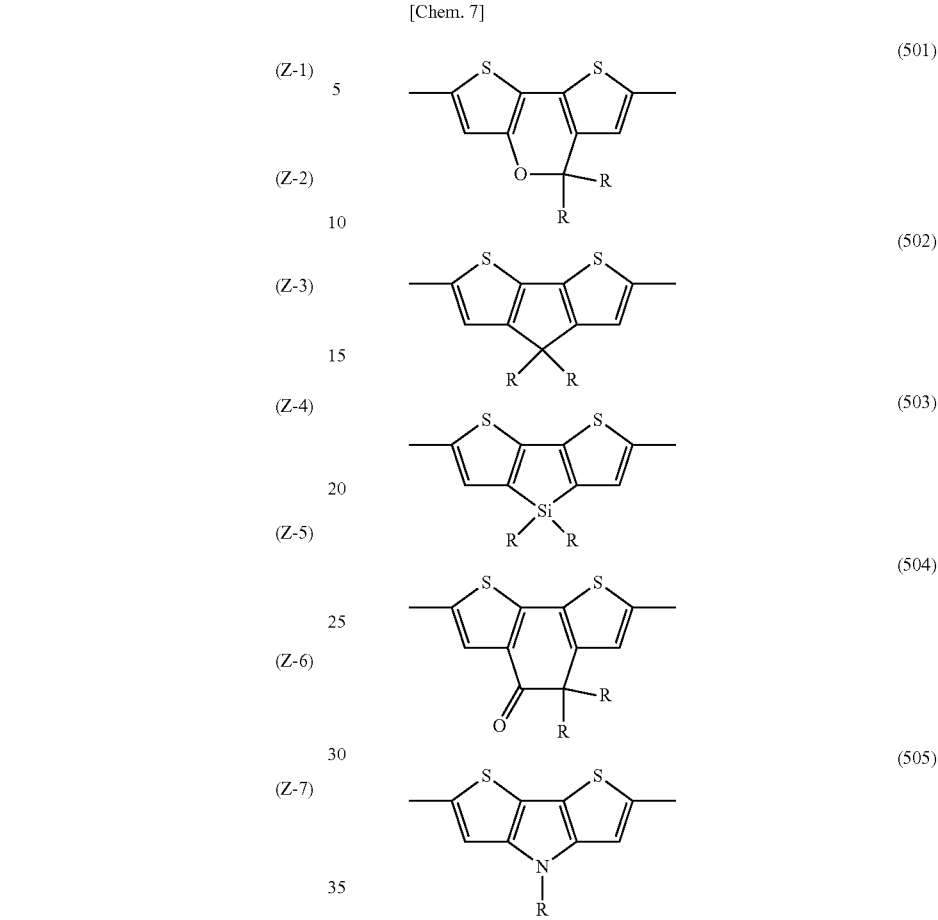

(501)
(502)
(503)
(504)
(505)

In the formulae (Z-1) to (Z-7), R is a hydrogen atom, a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acid imide group, a substituted oxy carbonyl group, an alkenyl group, an alkynyl group, a cyano group, or a nitro group. In each of the formulae (Z-1) to (Z-7), if there are two Rs in the formula, the two Rs may be identical with or different from each other.

The structural unit represented by formula (I) may be preferably a structural unit represented by the following formula (I-1).

[Chem. 6]

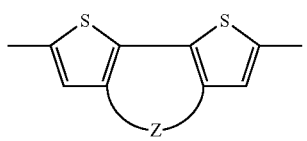

(I-1)

In the formula (I-1), Z is the same as above.

Examples of the structural units represented by formula (I-1) include structural units represented by the following formulae (501) to (505).

In the formulae (501) to (505), R is the same as above, Where if there are two Rs in the formula, the two Rs may be identical with or different from each other.

The number of carbon atoms in the divalent aromatic heterocyclic group indicated as $Ar^3$ is generally in a range of 2 to 60, preferably in a range of 4 to 60, or more preferably in a range of 4 to 20. The divalent aromatic heterocyclic group indicated as $Ar^3$ may be substituted. Examples of substituents that the divalent aromatic heterocyclic group indicated as $Ar^3$ may have include halogen atoms, alkyl group, aryl group, alkoxy group, aryloxy group, alkylthio group, arylthio group, monovalent heterocyclic groups, substituted amino group, acyl group, imine residue, amide group, acid imide group, substituted oxy carbonyl group, alkenyl group, alkynyl group, cyano group, and nitro group.

Examples of the divalent aromatic heterocyclic group indicated as $Ar^3$ include groups represented by the following formulae (101) to (185).

[Chem. 8]

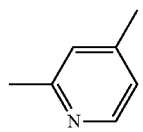

(101)

(102) 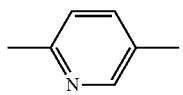
(103) 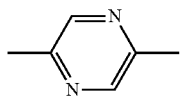
(104) 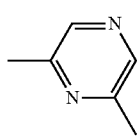
(105) 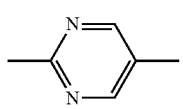
(106) 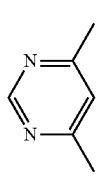
(107) 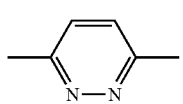
(108) 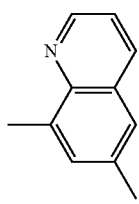
(109) 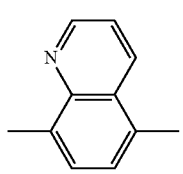
(110) 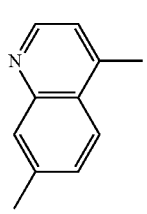
(111) 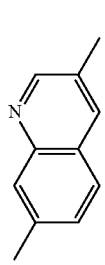
(112) 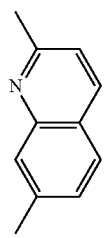
(113) 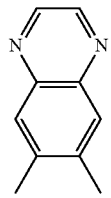
(114) 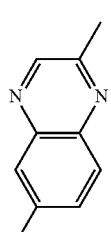
(115) 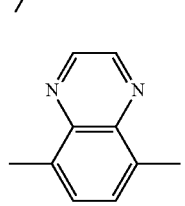
[Chem. 9]
(116) 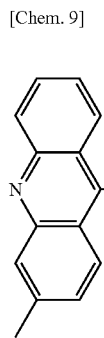
(117) 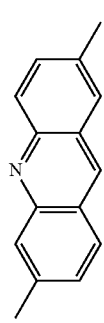

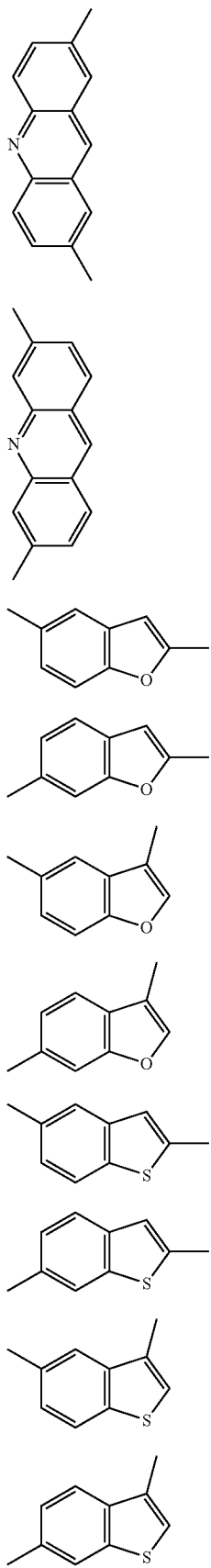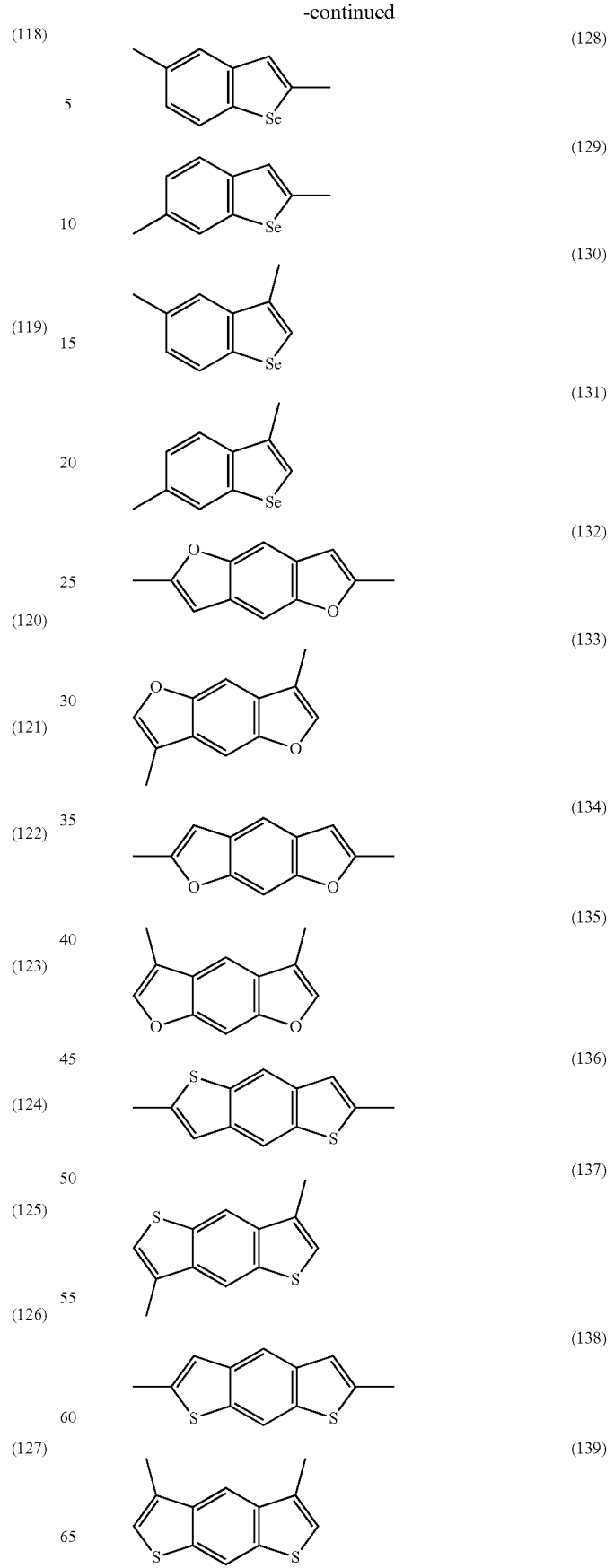

[Chem. 10]
(140) 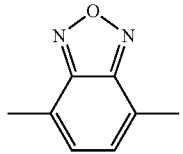
(141) 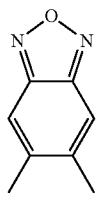
(142) 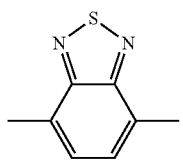
(143) 
(144) 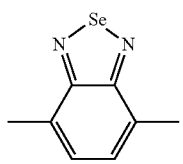
(145) 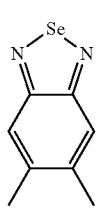
(146) 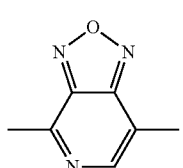
(147) 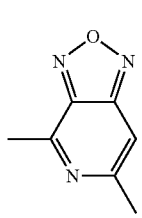
(148) 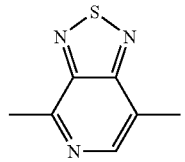
(149) 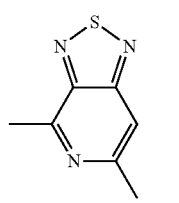
(150) 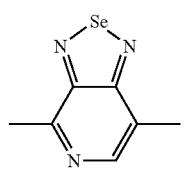
(151) 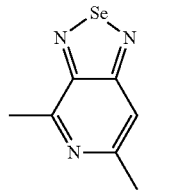
(152) 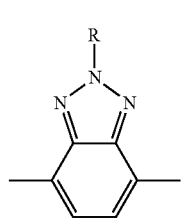
(153) 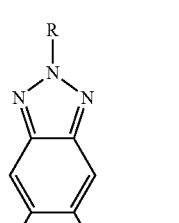
(154) 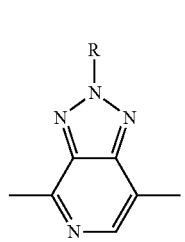

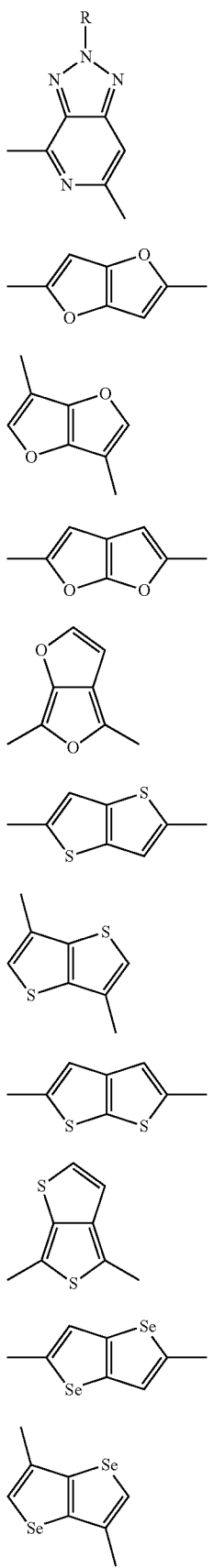
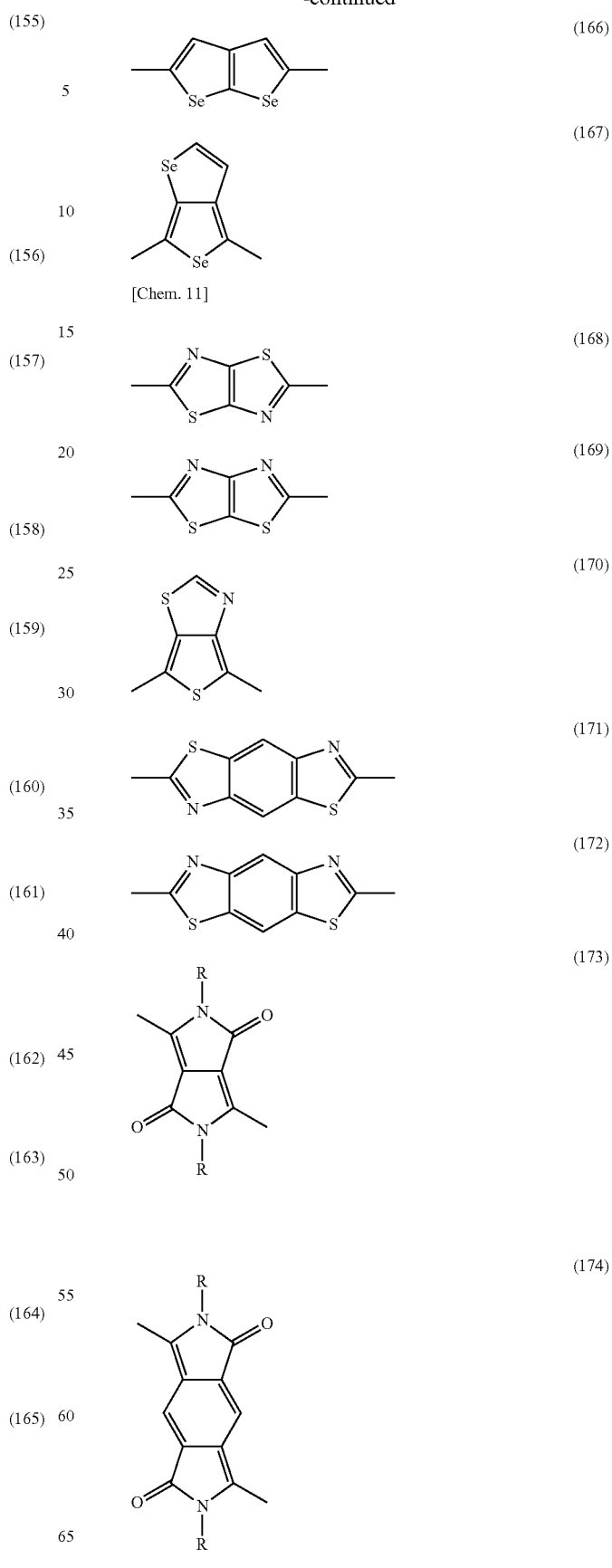

-continued

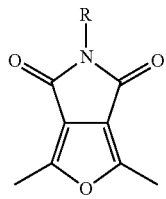
(175)

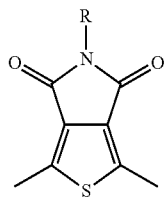
(176)

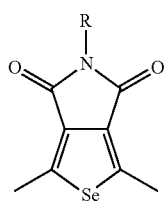
(177)

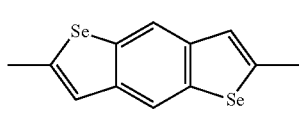
(178)

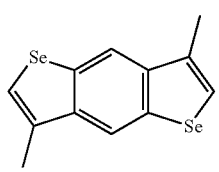
(179)

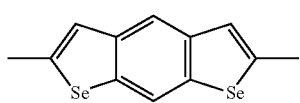
(180)

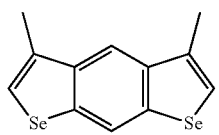
(181)

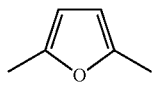
(182)

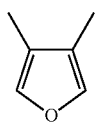
(183)

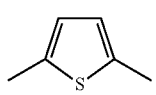
(184)

(185)

In the formulae (101) to (185), R is the same as above, where if there are a plurality of Rs in the formula, the plurality of Rs may be identical with or different from one another.

As the structural unit represented by formula (II), structural units represented by formula (II-1) to (II-6) are preferable.

[Chem. 12]

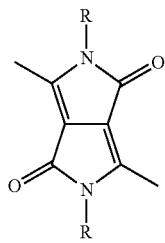
(II-1)

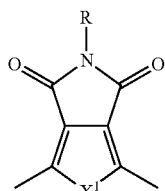
(II-2)

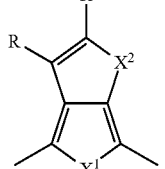
(II-3)

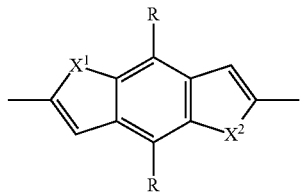
(II-4)

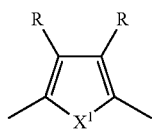
(II-5)

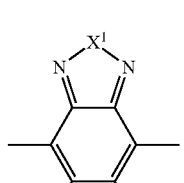
(II-6)

In the formulae (II-1) to (II-6), $X^1$ and $X^2$ are independently an oxygen atom or a sulfur atom, and R is the same as above, where if there are a plurality of Rs in the formula, the plurality of Rs may be identical with or different from one another.

For the sake of availability of raw material compounds, it is preferable that both of $X^1$ and $X^2$ be a sulfur atom in formulae (II-1) to (II-6).

The polymer compound being the p-type semiconductor material may contain two or more kinds of the structural units represented by formula (I), and may contain two or more kinds of the structural units represented by formula (II).

For the sake of better solubility in the solvent, the polymer compound being the p-type semiconductor material may contain a structural unit represented by the following formula (III).

[Chem. 13]

—$Ar^4$—      (III)

In the formula (III), $Ar^4$ is an arylene group.

The arylene group represented by $Ar^4$ is an atom group that is the residue of an aromatic hydrocarbon which may be substituted and from which two hydrogen atoms are removed. The aromatic hydro carbon also encompasses compounds having a fused ring, and compounds in which two or more rings selected from the group consisting of an independent benzene ring and fused rings are bonded together directly or via a divalent group such as a vinylene group.

Examples of substituents that the aromatic hydrocarbon may have include the same substituents as those exemplified as the substituents that the heterocyclic compound may have.

The number of carbon atoms in the arylene group, excluding the substituent, is generally in a range of 6 to 60, or preferably in a range of 6 to 20. The number of carbon atoms in the arylene group, including the substituent, is generally in a range of 6 to 100.

Examples of the arylene group include phenylene group (for example, the following formulae 1 to 3), naphthalene-diyl group (for example, the following formulae 4 to 13), anthracene-diyl group (for example, the following formulae 14 to 19), biphenyl-diyl group (for example, the following formulae 20 to 25), terphenyl-diyl group (for example, the following formulae 26 to 28), fused cyclic compound group (for example, the following formulae 29 to 35), fluorene-diyl group (for example, the following formulae 36 to 38), and benzofluorene-diyl group (for example, the following formulae 39 to 46).

[Chem. 14]

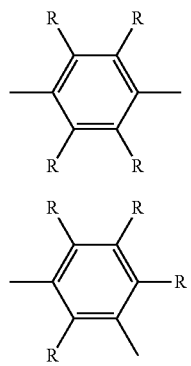

[Chem. 15]

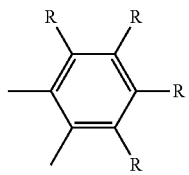

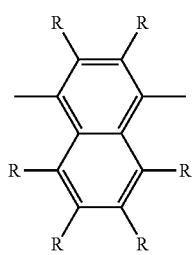

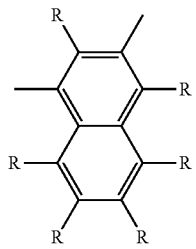

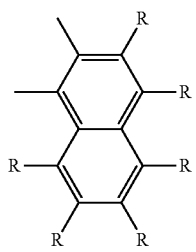

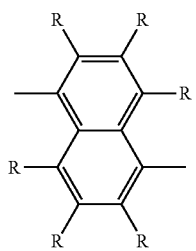

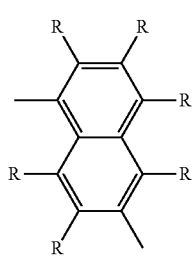

-continued
9
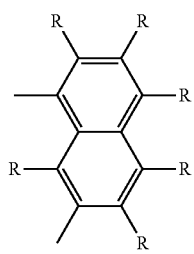
10
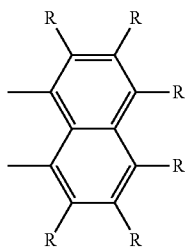
11
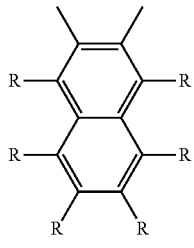
12
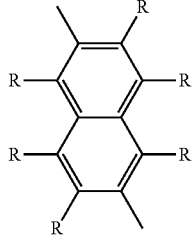
13
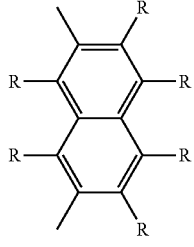
[Chem. 16]
14
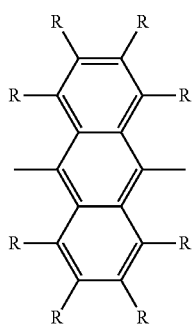
-continued
15
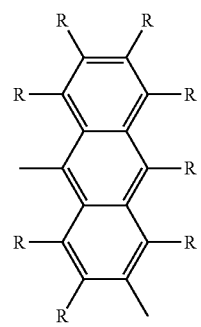
16
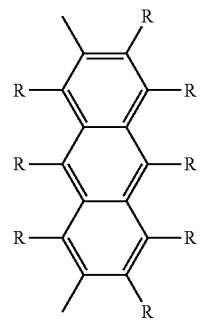
17
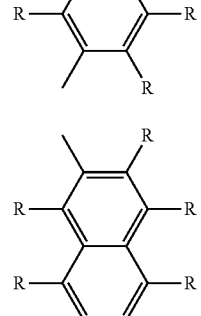
18
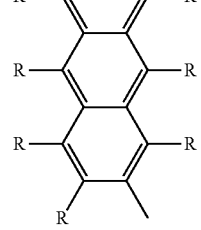
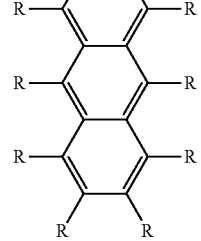
19
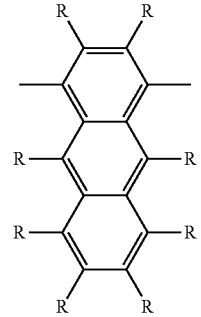

[Chem. 17]
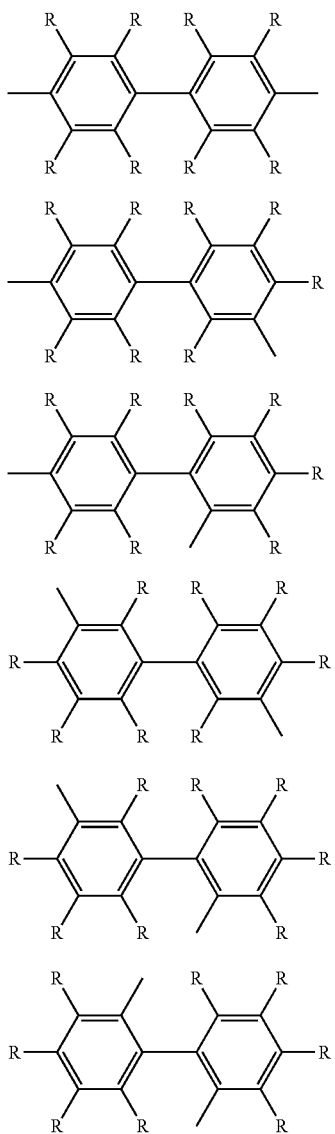
20
21
22
23
24
25
[Chem. 18]
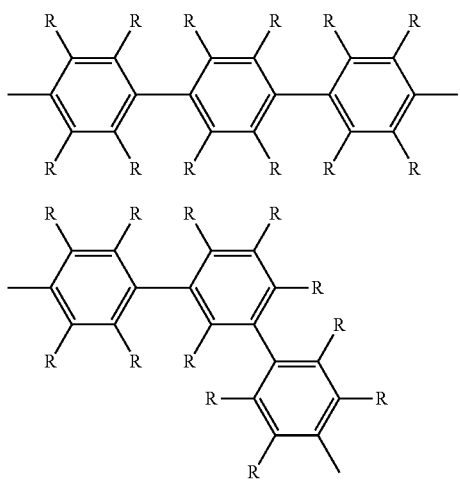
26
27
[Chem. 19]
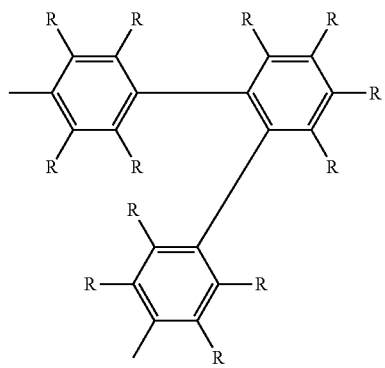
28
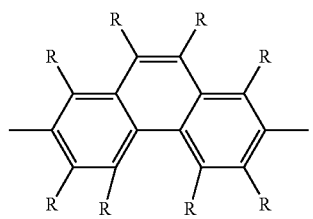
29
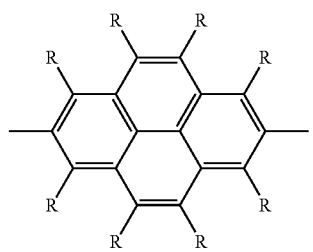
30
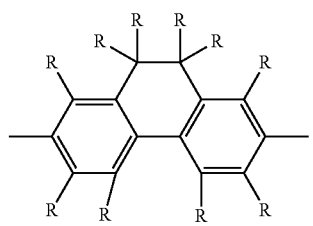
31
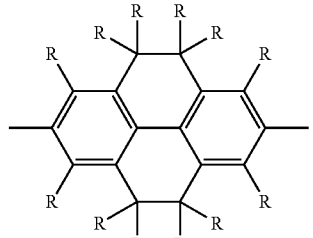
32
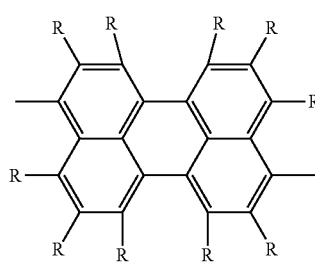
33

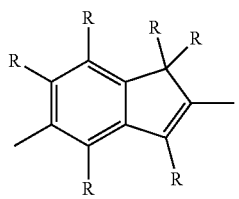
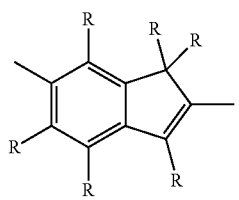
[Chem. 20]
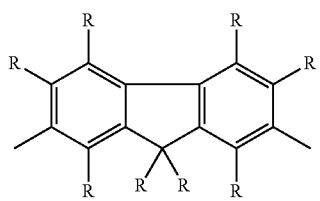
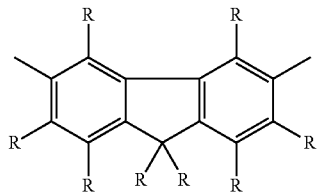
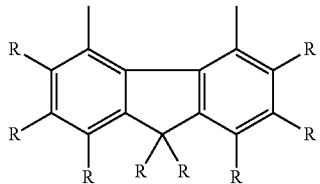
[Chem. 21]
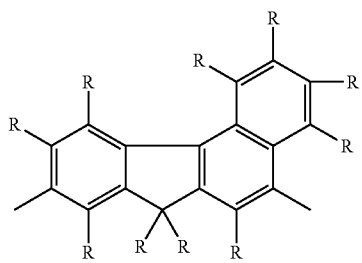
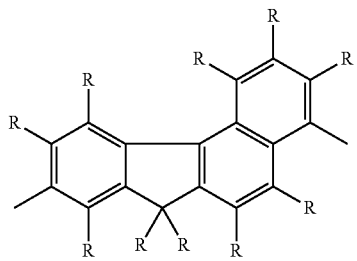
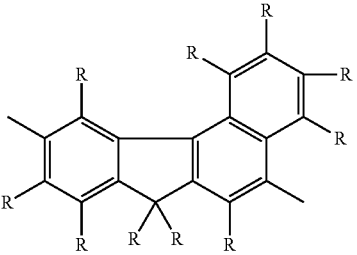
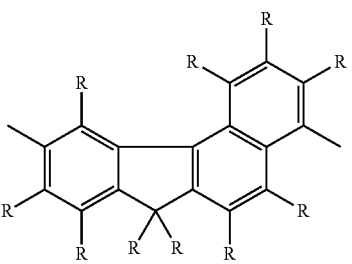
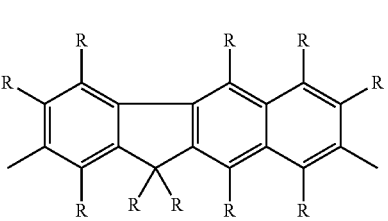
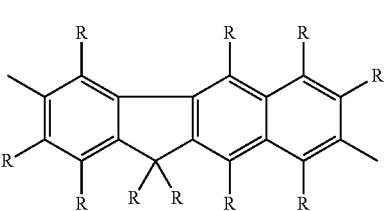
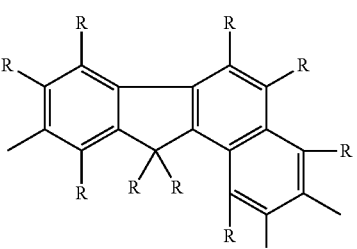
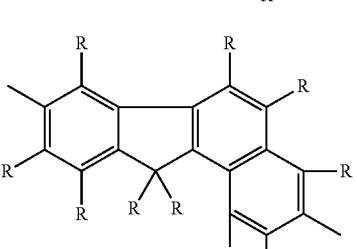
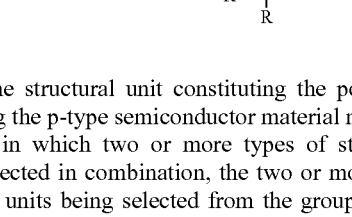
The structural unit constituting the polymer compound being the p-type semiconductor material may be a structural unit in which two or more types of structural units are connected in combination, the two or more types of structural units being selected from the group consisting of the structural unit represented by formula (I), the structural unit represented by formula (II), and the structural unit represented by formula (III).

If the polymer compound being the p-type semiconductor material include the structural unit represented by formula (I) and/or the structural unit represented by formula (II), a sum of the structural unit represented by formula (I) and the structural unit represented by formula (II) is generally in a range of 20 mol % to 100 mol %, where a total amount of all structural units contained in the polymer compound is 100 mol %. For the sake of better electron transport property as a p-type semiconductor material, the sum of the structural unit represented by formula (I) and the structural unit represented by formula (II) may be preferably in a range of 40 mol % to 100 mol %, or more preferably in a range of 50 mol % to 100 mol %.

The concrete examples of the polymer compound being the p-type semiconductor material include polymer compounds represented by the following formulae P-1 to P-6.

[Chem. 22]

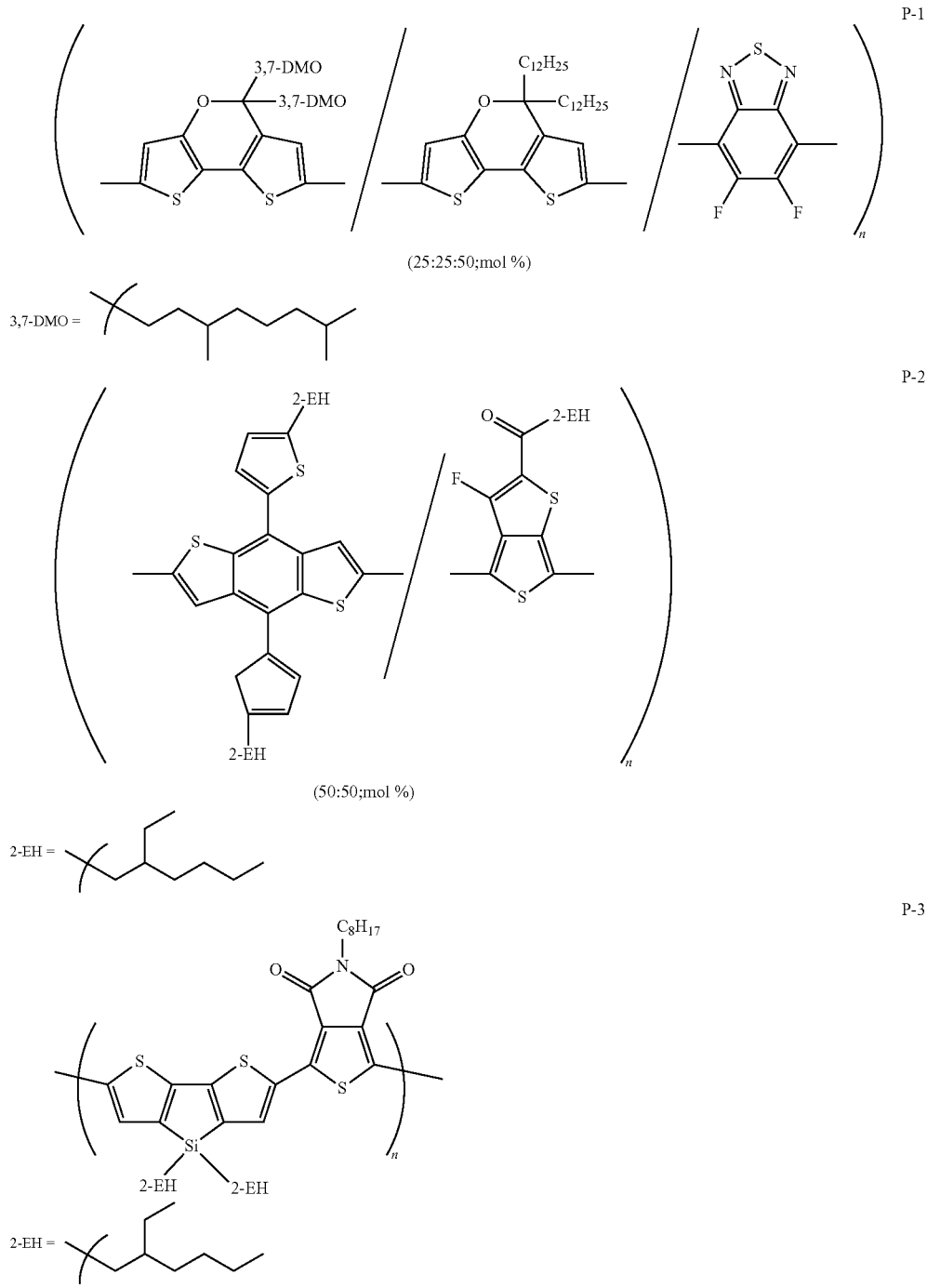

[Chem. 23]

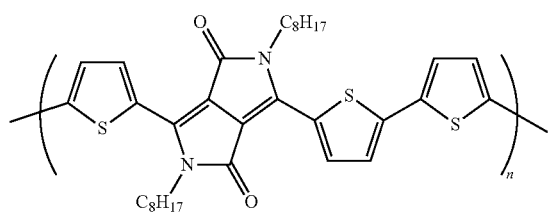

P-4

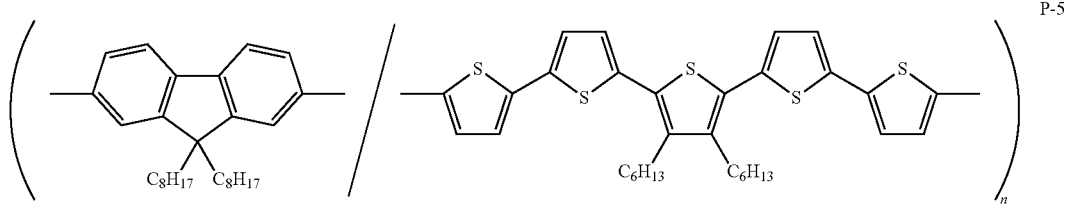

P-5

(50:50;mol %)

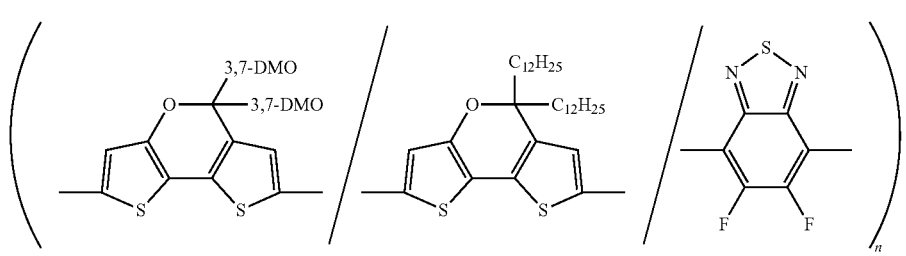

P-6

(25:25:50;mol %)

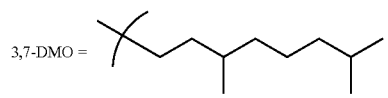

The coating liquid for forming the active layer may include only one type of the p-type semiconductor material or may include two or more types of the p-type semiconductor materials in combination at an arbitrary ratio.

(n-Type Semiconductor Material)

The n-type semiconductor material may be preferably a $C_{60}$ fullerene derivative. What is meant by the $C_{60}$ fullerene derivative is a compound in which at least part of the $C_{60}$ fullerene is modified.

Examples of the fullerene derivative include compounds represented by formulae (N-1) to (N-4) below.

[Chem. 24]

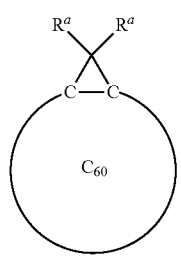

(N-1)

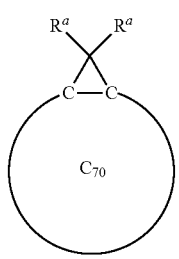

(N-2)

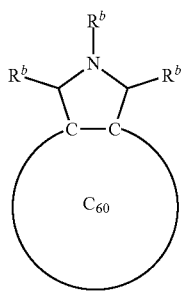

(N-3)

-continued (N-4)

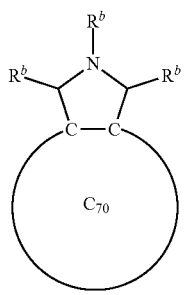

In the formulae (N-1) to (N-4), $R^a$ is an alkyl group, an aryl group, a monovalent heterocyclic group, or a group having an ester structure, where if there are a plurality of $R^a$ in the formula, the plurality of $R^a$ may be identical with or different from one another, and $R^b$ is an alkyl group or an aryl group, where the plurality of $R^b$ may be identical with or different from one another.

Examples of the group having an ester structure represented by $R^a$ include a group represented by the following formula (19).

[Chem. 25]

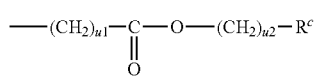

(19)

In the formula (19), u1 is an integer in a range of 1 to 6, u2 is an integer in a range of 0 to 6, and $R^c$ is an alkyl group, an aryl group, or a monovalent heterocyclic group.

Examples of $C_{60}$ fullerene derivatives include the following compounds.

[Chem. 26]

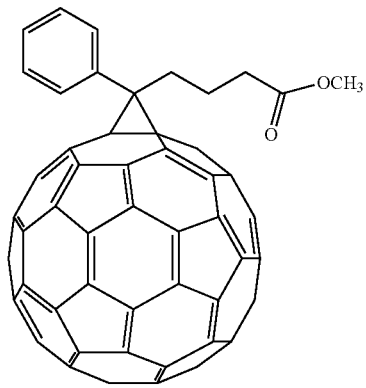

-continued

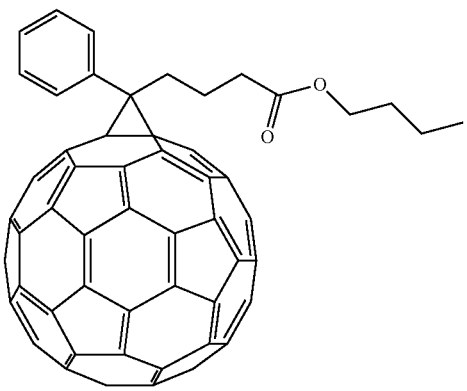

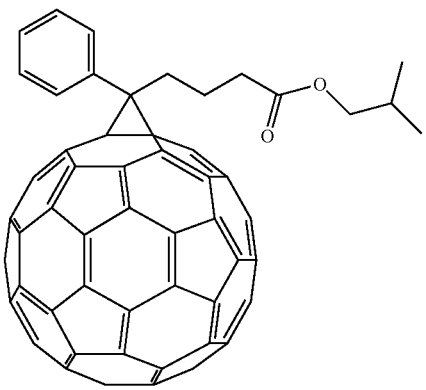

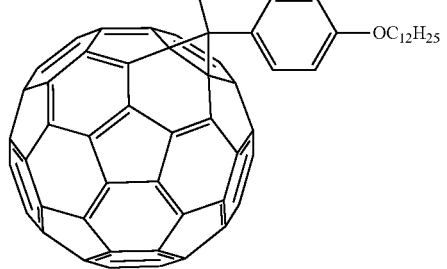

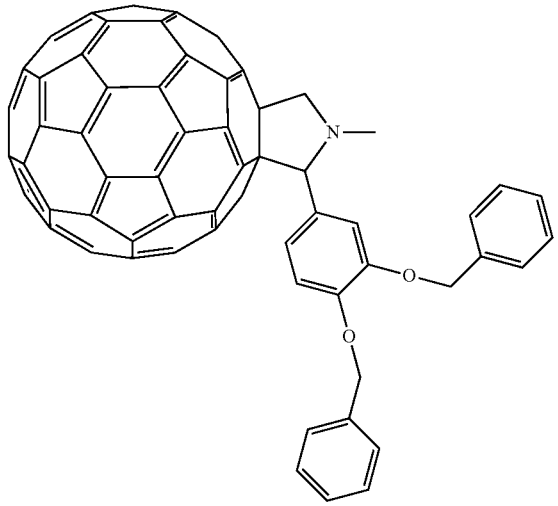

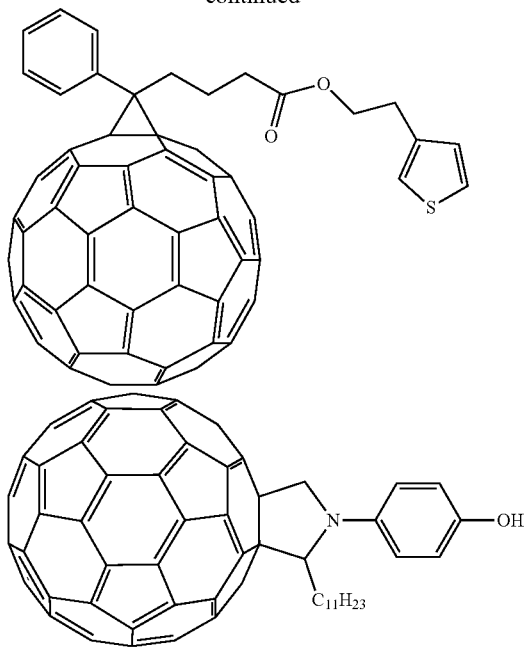

Concrete examples of the $C_{60}$ fullerene derivatives include [6,6]-phenyl-C61 butyric acid methyl ester (C60PCBM, [6,6]-phenyl-C61 butyric acid methyl ester), and [6,6]-Thienyl C61 butyric acid methyl ester ([6,6]-Thienyl C61 butyric acid methyl ester).

The coating liquid for forming the active layer may include only one kind of the n-type semiconductor material or two or more types of the n-type semiconductor materials in combination at an arbitrary ratio.

(Solvent)

The coating liquid for forming the active layer may include only one type of solvent or may include two or more types of solvents in combination at an arbitrary ratio. In case where the coating liquid for forming the active layer includes two or more types of solvents, it is preferable that the coating liquid for forming the active layer include a main solvent that is a main component (which is referred to as a first solvent), and an additional solvent added for improvement of the solubility or the like (which is referred to as a second solvent). The first solvent and the second solvent will be described below.

(1) First Solvent

The solvent can be selected in consideration of solubility for the p-type semiconductor material and the n-type semiconductor material thus selected, and properties (such as boiling point) for drying conditions for forming the active layer.

The first solvent being a main solvent may be preferably an aromatic hydrocarbon (hereinafter, referred to as simply the aromatic hydrocarbon), that may be substituted with a substituent(s) (such as an alkyl group(s) or a halogen atom(s)). The first solvent may be preferably selected in consideration of the solubility for the p-type semiconductor material and the n-type semiconductor material thus selected.

Examples of such aromatic hydrocarbon include toluene, xylene (for example, o-xylene, m-xylene, and p-xylene), trimethyl benzene (for example, mesitylene, 1,2,4-trimethylbenzene (pseudocumene)), butyl benzene (for example, n-butylbenzene, sec-butylbenzene, tert-butylbenzene), methyl naphthalene (for example, 1-methylnaphthalene), tetralin, indan, chlorobenzene, and dichlorobenzene (o-dichlorobenzene).

The first solvent may include only one type of the aromatic hydrocarbon or may include two or more types of the aromatic hydrocarbons. It is preferable that the first solvent includes only one type of the aromatic hydrocarbon.

The first solvent may preferably include one or more types selected from the group consisting of toluene, o-xylene, m-xylene, p-xylene, mesitylene, pseudocumene, n-butylbenzene, sec-butylbenzene, tert-butylbenzene, methylnaphthalene, tetralin, indan, chlorobenzene, and o-dichlorobenzene, more preferably o-xylene, pseudocumene, chlorobenzene, and o-dichlorobenzene.

(2) Second Solvent

It is preferable that the second solvent be a solvent selected especially for the sake of making the process for manufacturing easier, and further improving the property of the photoelectric conversion element. Examples of the second solvent include: ketone solvents such as acetone, methylethylketone, cyclohexanone, acetophenone, and propiophenone; ester solvents such as ethyl acetate, butyl acetate, phenyl acetate, ethyl cellosolve acetate, methyl benzoate, butyl benzoate, and benzyl benzoate.

For the sake of reducing the dark current, it is preferable that the second solvent be acetophenone, propiophenone, or benzyl benzoate.

(3) Combination of the First Solvent and the Second Solvent

Examples of a suitable combination of the first solvent and the second solvent include a combination of o-xylene and acetophenone.

(4) Weight Ratio of the First Solvent and the Second Solvent

A weight ratio of the second solvent that is an additional solvent and the first solvent being a main solvent (first solvent:second solvent) is preferably in a range of 85:15 to 99:1, for the sake of further improving the solubility for the p-type semiconductor material and the n-type semiconductor material.

(5) Weight Percentage of the Sum of the First Solvent and the Second Solvent

A total weight of the first solvent and the second solvent in the coating liquid may be preferably 90 wt % or more, more preferably 92 wt % or more, or further preferably 95 wt % or more, where the total weight of the coating liquid is 100 wt %, for the sake of further improving the solubility for the p-type semiconductor material and the n-type semiconductor material, and may be preferably 99.9 wt % or less for the sake of making it easier to form a layer with a thickness equal to or thicker than a certain thickness by increasing the densities of the p-type semiconductor material and the n-type semiconductor material in the coating liquid, more preferably 98.9 wt % or less, still more preferably 97.5 wt % or less.

(6) Optional Other Solvent

The solvent may include an optional solvent other than the first solvent and the second solvent. A content ratio of the optional other solvent may be preferably 5 wt % or less, more preferably 3 wt % or less, or further preferably 1 wt % or less, where the total weight of all the solvents in the coating liquid is 100 wt %. The optional other solvent may be preferably a solvent with a boiling point higher than that of the second solvent.

(7) Optional Component

The coating liquid may include an optional component such as an ultraviolet absorbing agent, an anti-oxidant, a sensitizer for giving a greater sensibility to the function of generating electric charge from the absorbed light, and a light stabilizer for increasing stability against ultraviolet rays, in addition to the first solvent, the second solvent, the p-type semiconductor material, and the n-type semiconductor material, as long as the optional component will not act against the object and effect of the present invention.

(Concentration of the p-Type Semiconductor Material, and the n-Type Semiconductor Material in the Coating Liquid)

The concentration of the sum of the p-type semiconductor material and the n-type semiconductor material in the coating liquid may be preferably not less than 0.01 wt % but not more than 20 wt %, more preferably not less than 0.01 wt % but not more than 10 wt %, further preferably not less than 0.01 wt % but not more than 5 wt %, and especially preferably not less than 0.1 wt % but not more than 5 wt %. The p-type semiconductor material and the n-type semiconductor material may be dissolved or dispersed in the coating liquid. It is preferable that the p-type semiconductor material and the n-type semiconductor material be at least partially dissolved therein, and it is more preferable that the p-type semiconductor material and the n-type semiconductor material be wholly dissolved therein.

(Preparation of the Coating Liquid)

The coating liquid may be prepared by a well-known method. For example, the coating liquid may be prepared by a method including mixing the first solvent and the second solvent together so as to prepare a mixture solvent, and adding the p-type semiconductor material and the n-type semiconductor material in the mixture solvent, a method including adding the p-type semiconductor material in the first solvent, adding the n-type semiconductor material in the second solvent, and mixing the first solvent and the second solvent together, in which the p-type semiconductor material and the n-type semiconductor material have been respectively added, or the like method.

The first solvent and the second solvent, and the p-type semiconductor material and the n-type semiconductor material may be mixed together after being heated up to a temperature equal to or lower than the boiling points of the solvents.

The coating liquid may be such that, after mixing the first solvent and the second solvent, and the p-type semiconductor material and the n-type semiconductor material together, a mixture thus obtained is filtered with a filter, and a filtrate thus obtained is used as the coating liquid. The filter may be, for example, a filter formed from a fluororesin such as polytetrafluoroethylene (PTFE).

(Step of Forming the Hole Transport Layer)

A manufacturing method of the photoelectric conversion element may include a step of forming a hole transport layer (hole injection layer) provided between the active layer and the anode. In the present embodiment, the hole transport layer is formed on the active layer.

A forming method of the hole transport layer is not particularly limited. For the sake of further simplifying the step of forming the hole transport layer, it is preferable that the hole transport layer be formed by a coating method. For example, the hole transport layer may be formed by coating a coating liquid containing the above-described material of the hole transport layer and a solvent on the active layer.

Examples of the solvent constituting the coating liquid for use in the coating method include water, alcohols, ketones, hydrocarbons, and the like. Concrete examples of the alcohols include methanol, ethanol, isopropanol, butanol, ethylene glycol, propylene glycol, butoxy ethanol, and methoxy butanol, and the like. Concrete examples of ketones include acetone, methyl ethyl ketone, methyl isobutyl ketone, 2-heptanone, and cyclohexanone, and the like. Concrete examples of the hydrocarbons include n-pentane, cyclohexane, n-hexane, benzene, toluene, xylene, tetralin, chlorobenzene, and o-dichlorobenzene, and the like. The coating liquid may include only one type of solvent or two or more types of solvents, and may include two or more types of the solvents mentioned above. An amount of the solvent(s) in the coating liquid is preferably not less than 1 part by weight but not more than 10000 parts by weight, or more preferably not less than 10 parts by weight but not more than 1000 parts by weight, with respect to 1 part by weight of the material of the hole transport layer.

Examples of a method of applying the coating liquid containing the material of the hole transport layer and the solvent (coating method) include a spin coating method, a casting method, a microgravure coating method, a gravure coating method, a bar coating method, a roll coating method, a wire bar coating method, a dip coating method, a spray coating method, a screen printing method, flexo printing method, an offset printing method, an inkjet printing method, a dispenser printing method, a nozzle coating method, a capillary coating method, and the like. Among these, the spin coating method, the flexo printing method, the inkjet printing method, and the dispenser printing method are preferable.

It is preferable that a coating film thus formed by coating the coating liquid containing the material of the hole transport layer and the solvent be subjected to a heat treatment, an air-drying treatment, reduced pressure treatment, or the like, thereby removing the solvent from the coating.

(Step of Forming the Anode)

The anode is generally formed on the active layer. In case where the method of forming the photoelectric conversion element according to the present embodiment includes the step of forming the hole transport layer, the anode is formed on the hole transport layer.

A method of forming the anode is not particularly limited. The anode may be formed on the layer on which the anode is to be formed (for example, the active layer or the hole transport layer), by applying the material described above by a vacuum deposition method, a sputtering method, an ion plating method, a plating method, a coating method, or the like.

In case where the material of the anode is polyaniline or a derivative thereof, polythiophene or a derivative thereof, nano particles of an electrically conductive material, nano wires of an electrically conductive material, or a nano tubes of an electrically conductive material, the anode may be formed by a coating method with an emulsion (emulsion), a suspension (suspension) or the like containing such a material and a solvent.

Moreover, if the material of the anode contains an electrically conductive material, the anode may be formed by a coating method with a coating liquid, metal ink, a metal paste, a melted low-melting point metal, or the like containing the electrically conductive material. Examples of the coating method of the coating liquid containing the material of the anode and the solvent include methods similar to these methods for the step of forming the active layer described above.

Examples of the solvent contained in the coating liquid for forming the anode by the coating method include: hydrocarbon solvents such as toluene, xylene, mesitylene, tetralin, decalin, bicyclohexyl, n-butylbenzene, sec-butylbenzene, and tert-butylbenzene; halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, and bromocyclohexane; halogenated aromatic hydrocarbon solvents such as chlorobenzene, dichlorobenzene, and trichlorobenzene; ether solvents such as tetrahydrofurane and tetrahydropyrane; water; alcohols; and the like. Concrete examples of the alcohols include methanol, ethanol, isopropanol, butanol, ethylene glycol, propylene glycol, butoxy ethanol, methoxy butanol, and the like. The coating liquid may solely include one type of solvent may include two or more types of solvents, or may include two or more types of the solvents listed above.

EXAMPLES

In the followings, examples will be described in order to explain the present invention in more detail. It should be noted that the present invention is not limited to the examples described below.

In this Example, the p-type semiconductor material (electron donor compound) was the polymer compound represented by formula P-1 described above and the n-type semiconductor material (electron acceptor compound) was $C_{60}PCBM$.

Example 1

Manufacturing and Evaluation of Photoelectric Conversion Element.
(1) Manufacturing of Photoelectric Conversion Element.

By a sputtering method, a glass substrate on which an ITO thin film (cathode) with a thickness of 150 nm was formed was prepared, and a surface of the glass substrate was subject to ozone UV treatment.

Next, a coating liquid prepared by diluting ethoxylated polyethyleneimine (PEIE) (manufactured by Aldrich, product name polyethyleneimine, 80% ethoxylated solution, weight average molecular weight 110000) with water to a 1/100 concentration was applied, by the spin coating method, on the ITO thin film on the glass substrate having been subjected to the ozone UV treatment.

The glass substrate with the coating liquid thus applied was heated at 120° C. for 10 min by using a hot plate, thereby forming an electron transport layer a on the ITO thin film serving as the cathode. Here, the electron transport layer a thus formed was evaluated in terms of the surface roughness (details thereof will be described later).

Next, the polymer compound represented by formula P-1 described above and $C_{60}PCBM$ (manufactured by Frontier CARBON Corporation, Product name: E100) were mixed together at a weight ratio of 1:2, and added into a mixture solvent containing o-xylene as the first solvent and acetophenone as the second solvent (o-xylene:acetophenone=95:5 (weight ratio)), and a mixture thus prepared was stirred at 80° C. for 10 hours, thereby preparing a coating liquid for forming an active layer.

The coating liquid for forming the active layer thus prepared was applied on the electron transport layer on the glass substrate by the spin coating method, and a coated film thus obtained was dried for 5 min by using a hot plate heated to 100° C., thereby forming the active layer. The active layer thus formed had a thickness of 400 nm.

Next, a polythiophene derivative (manufactured by Solvay S.A., Product Name: AQ1300) was applied on the active layer by the spin coating method, and subjected to heat treatment of 70° C. for 5 min using the hot plate, thereby forming a hole transport layer. The hole transport layer thus formed had a thickness of about 70 nm.

After that, in a resistance heating deposition device, a silver (Ag) layer of about 80 nm in thickness was formed as an anode on the electron transport layer a thus formed, thereby manufacturing a photoelectric conversion element (light detecting element).

Next, a UV-curing sealing agent was applied on the glass substrate, which was the surrounding of the photoelectric conversion element thus manufactured, and a glass substrate serving as a sealing substrate was adhered thereto. After that, UV light was radiated on the photoelectric conversion element, thereby sealing the photoelectric conversion element. The photoelectric conversion element thus obtained had a square shape of 2 mm×2 mm when viewed from above in the thickness direction thereof.

(2) Evaluation of Properties of Photoelectric Conversion Element

Properties of the photoelectric conversion element thus manufactured were evaluated. Using a voltage application of −2 V, external quantum efficiency (EQE) under −2 V voltage application and dark current were measured by using a spectral response measuring device (CEP-2000, manufactured by Bunkoukeiki Co., Ltd.) and a semiconductor parameter analyzer (Agilent Technology B1500A, manufactured by Agilent Technology).

For the EQE, light of wavelength of 850 nm (the number of photons: $1.0 \times 10^{16}$) was radiated on the photoelectric conversion element under −2 V voltage application, where the wavelength of 850 nm was the maximum absorption wavelength ($\lambda_{max}$) of the compound A, and a current value of a current generated in the photoelectric conversion element was measured. From the measurement value, a measurement value of the EQE was worked out by a well-known method.

Next, from the measurement value thus obtained and a calculation equation as below, detectivity (D*) (Jones) under −2 V voltage application was calculated out.

$$D^* = \frac{(\lambda_{max}/1240) \times (EQE)}{\sqrt{2eJ_d}}$$ [Math. 1]

In the formula, EQE is the external quantum efficiency and indicates EQE at $\lambda_{max}$, e is elementary charge, and $J_d$ is dark current density.

(3) Evaluation of Surface Roughness

The surface roughness of the electron transport layer a was evaluated by using an atomic force microscope (AFM), observing the glass substrate on which the electron transport layer was formed as described above. The AFM used was OMCL-AC160TS-W2, manufactured by Olympus Corporation. An AFM probe used was SI-DF20 (with back-surface AL), manufactured by Hitachi High-Tech Science Corporation.

The measurement was carried out under non-contact AC mode with an observation field of 300 nm×300 nm. From a cross-sectional profile thus obtained, a surface roughness RMS (root mean square of height, Rq) was worked out according to a method in conformity with the standard provided under JIS B 0601 (2001). The surface roughness RMS of the electron transport layer a of Example 1 was 0.55 nm.

Examples 2 and 3, and Comparative Examples 1 and 2

A photoelectric conversion element (light detecting element) was manufactured as in Example 1 described above except that the thickness of the active layer was changed as shown in Table 1 below by adjusting the rotation speed of the spin coating method, and the photoelectric conversion element was evaluated as in Example 1. The detectivities D* are shown in Table 1.

Comparative Examples 3 to 8

A light detecting element was manufactured as in Example 1 described above except that the electron transport layer was not formed and the thickness of the active layer was changed as shown in Table 1 below, and the light detecting element was evaluated as in Example 1. The detectivities D* are shown in Table 1.

Comparative Examples 9 to 12

A light detecting element was manufactured as in Example 1 described above except that a solution prepared by diluting PEIE with water to a 1/50 concentration was applied on the ITO thin film by the spin coating method, and subjected to heat treatment at 120° C. for 10 min by using a hot plate, thereby forming an electron transport layer b, and the thickness of the active layer was changed as shown in Table 1 below.

The properties of the photoelectric conversion element and surface roughness of the electron transport layer b were evaluated as in Example 1. The detectivities D* are shown in Table 1. The surface roughness RMS of the electron transport layer of Comparative Examples 9 to 12 was 0.22 nm.

Examples 4 and 5, and Comparative Examples 13 and 14

A light detecting element was manufactured as in Example 1 described above except that a solution prepared by diluting PEIE with water to a 1/500 concentration was applied on the ITO thin film by the spin coating method, and subjected to heat treatment at 120° C. for 10 min by using a hot plate, thereby forming an electron transport layer c, and the thickness of the active layer was changed as shown in Table 1 below.

The properties of the photoelectric conversion element and surface roughness of the electron transport layer c were evaluated as in Example 1. The detectivities D* are shown in Table 1. The surface roughness RMS of the electron transport layer c was 1.24 nm.

Examples 6 and 7, and Comparative Example 15

A light detecting element was manufactured as in Example 1 described above except that a dispersion of zinc oxide (manufactured by InfinityPV, Product name: Doped ZnO ink (water)) was applied on the ITO thin film by the spin coating method, and subjected to heat treatment at 120° C. for 10 min by using a hot plate, thereby forming an electron transport layer d (thickness: about 40 nm), and the thickness of the active layer was changed as shown in Table 1 below.

The properties of the photoelectric conversion element and surface roughness of the electron transport layer d were evaluated as in Example 1. The detectivities D* are shown in Table 1. The surface roughness RMS of the electron transport layer d was 1.13 nm.

Comparative Examples 16 to 18

A light detecting element was manufactured as in Example 1 described above except that a dispersion of zinc oxide (manufactured by Avantama, Product name: Avantama N-10) was applied on the ITO thin film by the spin coating method, and subjected to heat treatment at 120° C. for 10 min by using a hot plate, thereby forming an electron transport layer e (thickness: about 40 nm), and the thickness of the active layer was changed as shown in Table 1 below.

The properties of the photoelectric conversion element and surface roughness of the electron transport layer e were evaluated as in Example 1. The detectivities D* are shown in Table 1. The surface roughness RMS of the electron transport layer e was 1.90 nm.

Comparative Examples 19 to 21

A light detecting element was manufactured as in Example 1 described above except that a solution prepared by diluting a dispersion of zinc oxide (manufactured by TAYCA, Product Name: HTD-711Z(IPA)) with 3-pentanol to a 1/10 concentration was applied on the ITO thin film by the spin coating method, and subjected to heat treatment at 120° C. for 10 min by using a hot plate, thereby forming an electron transport layer f (film thickness=about 50 nm), and the thickness of the active layer was changed as shown in Table 1 below.

The properties of the photoelectric conversion element and surface roughness of the electron transport layer f were evaluated as in Example 1. The detectivities D* are shown in Table 1. The surface roughness RMS of the electron transport layer f was 3.77 nm.

TABLE 1

|  | Electron transport layer | Surface roughness | Thickness of active layer (nm) | D* (Jones) |
|---|---|---|---|---|
| Example 1 | Electron transport layer a | 0.55 nm | 400 | $1.1 \times 10^{12}$ |
| Example 2 | Electron transport layer a | 0.55 nm | 500 | $1.0 \times 10^{12}$ |
| Example 3 | Electron transport layer a | 0.55 nm | 700 | $1.6 \times 10^{12}$ |
| Comparative Example 1 | Electron transport layer a | 0.55 nm | 350 | $6.1 \times 10^{11}$ |
| Comparative Example 2 | Electron transport layer a | 0.55 nm | 800 | $6.0 \times 10^{11}$ |
| Comparative Example 3 | — | — | 200 | $1.7 \times 10^{11}$ |
| Comparative Example 4 | — | — | 350 | $4.3 \times 10^{11}$ |
| Comparative Example 5 | — | — | 400 | $4.0 \times 10^{11}$ |
| Comparative Example 6 | — | — | 500 | $4.1 \times 10^{11}$ |
| Comparative Example 7 | — | — | 700 | $5.9 \times 10^{11}$ |
| Comparative Example 8 | — | — | 800 | $3.9 \times 10^{11}$ |
| Comparative Example 9 | Electron transport layer b | 0.22 nm | 200 | $1.7 \times 10^{11}$ |
| Comparative Example 10 | Electron transport layer b | 0.22 nm | 500 | $1.2 \times 10^{11}$ |
| Comparative Example 11 | Electron transport layer b | 0.22 nm | 700 | $2.9 \times 10^{11}$ |

TABLE 1-continued

| | Electron transport layer | Surface roughness | Thickness of active layer (nm) | D* (Jones) |
|---|---|---|---|---|
| Comparative Example 12 | Electron transport layer b | 0.22 nm | 850 | $1.2 \times 10^{11}$ |
| Example 4 | Electron transport layer c | 1.24 nm | 500 | $1.8 \times 10^{12}$ |
| Example 5 | Electron transport layer c | 1.24 nm | 700 | $1.7 \times 10^{12}$ |
| Comparative Example 13 | Electron transport layer c | 1.24 nm | 200 | $2.7 \times 10^{11}$ |
| Comparative Example 14 | Electron transport layer c | 1.24 nm | 350 | $6.9 \times 10^{11}$ |
| Example 6 | Electron transport layer d | 1.13 nm | 400 | $1.0 \times 10^{12}$ |
| Example 7 | Electron transport layer d | 1.13 nm | 500 | $1.0 \times 10^{12}$ |
| Comparative Example 15 | Electron transport layer d | 1.13 nm | 350 | $6.0 \times 10^{11}$ |
| Comparative Example 16 | Electron transport layer e | 1.90 nm | 350 | $3.4 \times 10^{11}$ |
| Comparative Example 17 | Electron transport layer e | 1.90 nm | 400 | $6.8 \times 10^{11}$ |
| Comparative Example 18 | Electron transport layer e | 1.90 nm | 500 | $6.5 \times 10^{11}$ |
| Comparative Example 19 | Electron transport layer f | 3.77 nm | 350 | $5.2 \times 10^{11}$ |
| Comparative Example 20 | Electron transport layer f | 3.77 nm | 400 | $5.2 \times 10^{11}$ |
| Comparative Example 21 | Electron transport layer f | 3.77 nm | 500 | $6.9 \times 10^{11}$ |

(Evaluation of Detectivity)

In order to evaluate the effect due to the difference of the surface roughness of that surface of the electron transport layer which is in contact with the active layer, Examples 1 to 7 and Comparative Examples 1 to 21 were evaluated by calculating out relative values of the detectivities (D* relative value) by applying the following equation: In the formula D*1/D*0, D*1 is a detectivity of the light detecting element with the electron transport layer a, the electron transport layer b, or the electron transport layer c, and D*0 is a detectivity of the light detecting element without an electron transport layer but with the active layer having a thickness identical with that in the light detecting element having the detectivities of D*1 with the electron transport layer a, the electron transport layer b, or the electron transport layer c.

Figure 4:
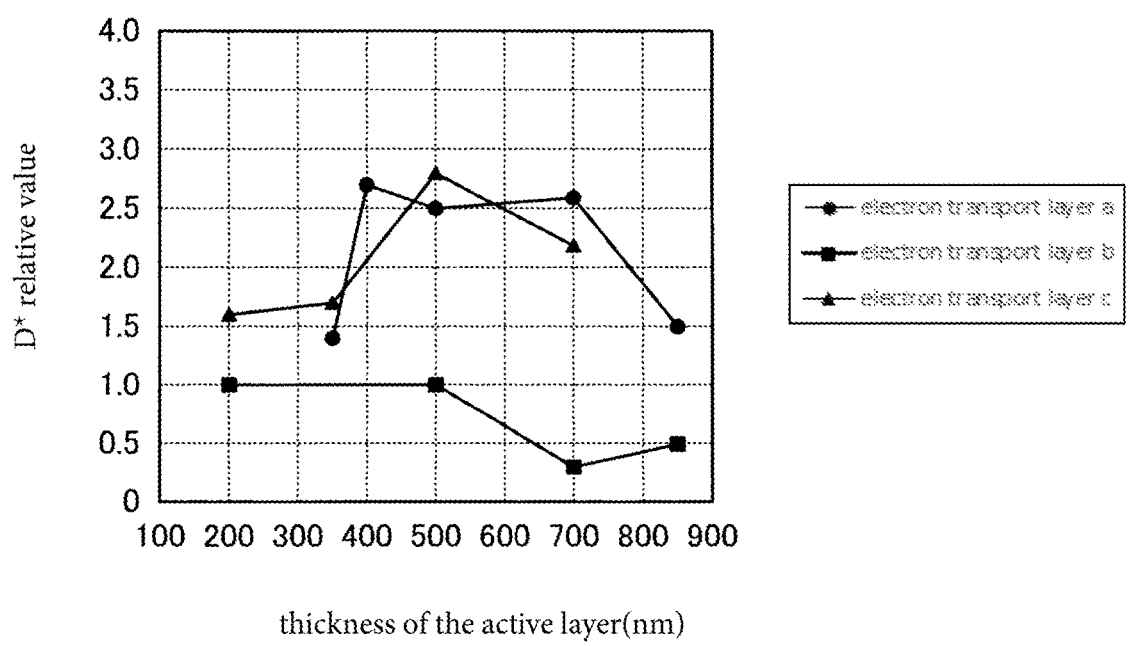
FIG. 4 is a graph illustrating a relationship between the D* relative value and the thickness of an active layer.
Figure 5:
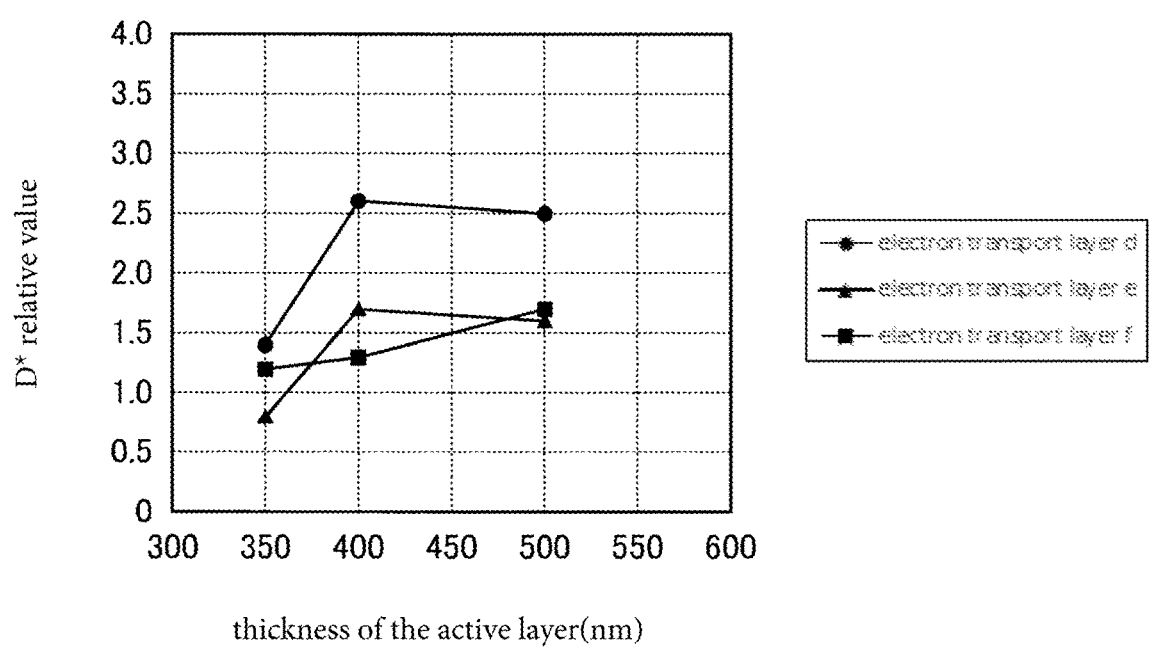
FIG. 5 is a graph illustrating a relationship between the D* relative value and the thickness of an active layer.

The results are shown in FIGS. 4 and 5. FIGS. 4 and 5 are graphs where the vertical axis is D* relative value and the horizontal axis is the thickness of the active layer. FIG. 4 illustrates the calculation values of Examples 1 to 5 and Comparative Examples 1 and 2, and 9 to 14 with the electron transport layer of PEIE. FIG. 5 illustrates the calculation values of Examples 6 and 7 and Comparative Examples 15 to 21 with the electron transport layer of ZnO.

As understood from FIGS. 4 and 5, the light detecting elements with the electron transport layer a, the electron transport layer c, or the electron transport layer d having a surface roughness in a range of 0.55 nm to 1.24 nm and with the active layer having a thickness greater than 350 nm but smaller than 800 nm provided a detectivity greater than that of the light detecting element without such an electron transport layer by about 1.5 times or more. Moreover, the light detecting elements with the electron transport layer a, or the electron transport layer c having a surface roughness in a range of 0.55 nm to 1.24 nm and with the active layer having a thickness not less than 400 nm but not more than 700 nm provided a detectivity greater than that of the light detecting element without such an electron transport layer by 2 times or more.

DESCRIPTION OF REFERENCE SIGNS

1 Image detecting section
2 Display device
10 Photoelectric conversion element
11, 210 Support substrate
12 Cathode
13 Electron transport layer
14 Active layer
15 Hole transport layer
16 Anode
17 Sealing member
20 CMOS transistor substrate
30 Interlayer insulating film
32 Interlayer wiring section
40 Sealing layer
50 Color filter
100 Fingerprint Detecting Section
200 Display panel section
200a Display region
220 Organic EL element
230 Touch sensor panel
240 Sealing substrate

The invention claimed is:

1. A light detecting element comprising a pair of electrodes, an active layer provided between the pair of electrodes, and an intermediate layer provided between the active layer and at least one of the pair of electrodes,
wherein the intermediate layer has a surface that is in direct contact with the active layer, the surface having a surface roughness in a range of 0.55 nm to 1.24 nm,
a thickness of the active layer is not less than 400 nm but not more than 700 nm;
wherein the intermediate layer is an electron transport layer;
wherein the electron transport layer comprises a polyalkylene imine or a derivative thereof,
wherein the active layer comprises an n-type semiconductor material and a p-type semiconductor material, and
wherein the p-type semiconductor material is a polymer compound comprising a structural unit represented by the following formula (I) and/or a structural unit represented by the following formula (II):

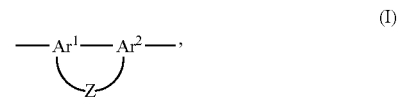

(I)

wherein in formula (I), $Ar^1$ and $Ar^2$ are trivalent aromatic heterocyclic groups, and Z is a group represented by formulae (Z-1) to (Z-7), $$—Ar^3— \quad (II),$$

wherein in formula (II), $Ar^3$ is a divalent aromatic heterocyclic group,

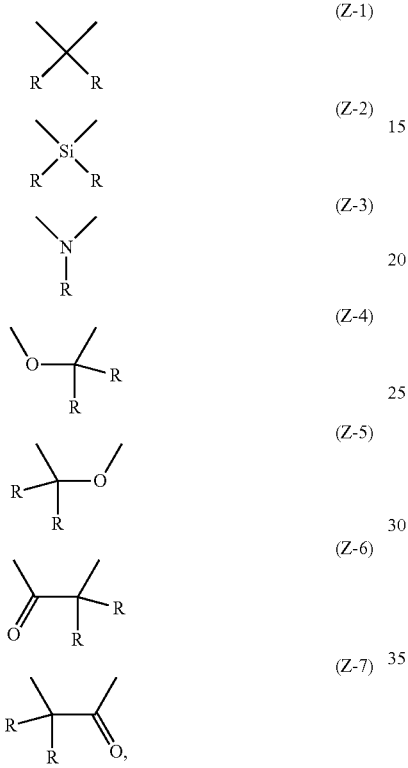

wherein in formulae (Z-1) to (Z-7), each R is independently selected from the group consisting of a hydrogen atom, a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acid imide group, a substituted oxy carbonyl group, an alkenyl group, an alkynyl group, a cyano group, and a nitro group.

2. The light detecting element according to claim 1, wherein the n-type semiconductor material is fullerene or a fullerene derivative.

3. The light detecting element according to claim 1, wherein the electron transport layer comprises a polymer obtained by polymerizing one or more alkylene imines with a number of carbon atoms in a range of 2 to 8.

4. The light detecting element according to claim 1, wherein the electron transport layer comprises a polymer obtained by polymerizing one or more alkylene imines with a number of carbon atoms in a range of 2 to 4.

5. The light detecting element according to claim 1, wherein the electron transport layer comprises polyethylene imine.

6. The light detecting element according to claim 1, wherein the electron transport layer comprises ethoxylated polyethylene imine.

7. A light detecting element comprising:
a support substrate;
a first electrode that is a thin electrically conductive film in direct contact with the support substrate and supported by the support substrate;
an intermediate layer in direct contact with the thin electrically conductive film;
an active layer in direct contact with the intermediate layer, and
a second electrode on the active layer,
wherein the intermediate layer has a surface that is in direct contact with the active layer, the surface having a surface roughness in a range of 0.55 nm to 1.24 nm,
a thickness of the active layer is not less than 400 nm but not more than 700 nm,
wherein the intermediate layer is an electron transport layer;
wherein the electron transport layer comprises a polyalkylene imine or a derivative thereof,
wherein the active layer comprises an n-type semiconductor material and a p-type semiconductor material, and
wherein the p-type semiconductor material is a polymer compound comprising a structural unit represented by the following formula (I) and/or a structural unit represented by the following formula (II):

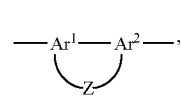

wherein in formula (I), $Ar^1$ and $Ar^2$ are trivalent aromatic heterocyclic groups, and Z is a group represented by formulae (Z-1) to (Z-7), $$—Ar^3— \quad (II)$$

wherein in formula (II), $Ar^3$ is a divalent aromatic heterocyclic group,

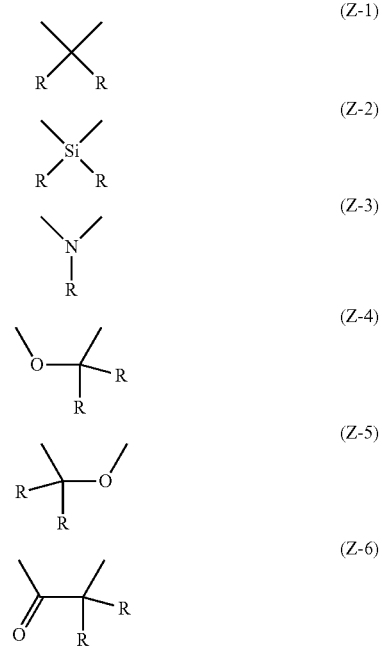

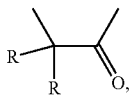
(Z-7)

wherein in formulae (Z-1) to (Z-7), each R is independently selected from the group consisting of a hydrogen atom, a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acid imide group, a substituted oxy carbonyl group, an alkenyl group, an alkynyl group, a cyano group, and a nitro group.

8. The light detecting element of claim 7, wherein the intermediate layer is coated on the thin electrically conductive film in direct contact with the thin electrically conductive film.

9. The light detecting element of claim 8, wherein the thin electrically conductive film is formed on the support substrate by vacuum deposition, sputtering, ion plating or plating.

10. The light detecting element of claim 8, wherein the thin electrically conductive film is formed on the support substrate by vacuum deposition or sputtering.

11. The light detecting element of claim 8, wherein the thin electrically conductive film is formed on the support substrate by sputtering.

12. The light detecting element of claim 7, wherein the thin electrically conductive film is formed on the support substrate by vacuum deposition, sputtering, ion plating, or plating.

13. The light detecting element of claim 7, wherein the thin electrically conductive film is formed on the support substrate by vacuum deposition or sputtering.

14. The light detecting element of claim 7, wherein the thin electrically conductive film is formed on the support substrate by sputtering.

* * * * *